United States Patent
Takanashi et al.

(10) Patent No.: US 8,927,201 B2
(45) Date of Patent: Jan. 6, 2015

(54) MULTILAYER RESIST PROCESS PATTERN-FORMING METHOD AND MULTILAYER RESIST PROCESS INORGANIC FILM-FORMING COMPOSITION

(71) Applicant: JSR Corporation, Tokyo (JP)

(72) Inventors: Kazunori Takanashi, Tokyo (JP); Yoshio Takimoto, Tokyo (JP); Takashi Mori, Tokyo (JP); Kazuo Nakahara, Tokyo (JP); Masayuki Motonari, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 14/038,861

(22) Filed: Sep. 27, 2013

(65) Prior Publication Data

US 2014/0030660 A1  Jan. 30, 2014

Related U.S. Application Data

(63) Continuation of application No. PCT/JP2012/058270, filed on Mar. 28, 2012.

(30) Foreign Application Priority Data

Mar. 30, 2011 (JP) .................... 2011-076627
Sep. 15, 2011 (JP) .................... 2011-202480

(51) Int. Cl.
G03F 7/26 (2006.01)
G03F 7/11 (2006.01)

(52) U.S. Cl.
CPC ... G03F 7/11 (2013.01); G03F 7/26 (2013.01)
USPC ............ 430/323; 430/322; 430/325; 430/315

(58) Field of Classification Search
CPC ........... G03F 7/11; G03F 7/091; G03F 7/095; G03F 7/168; G03F 7/094; G03F 7/40; G03F 7/0002; G03F 7/004; G03F 7/0757; G03F 7/0392; H01L 21/31138; H01L 21/31144; H01L 21/0332; H01L 21/0271; H01L 21/28123; H01L 21/32139; H01L 21/0274; H01L 21/02115; H01L 21/0337; C08L 83/06; C08G 77/14

USPC ................................. 430/323, 325, 315, 322
See application file for complete search history.

(56) References Cited

U.S. PATENT DOCUMENTS

| | | | | |
|---|---|---|---|---|
| 4,615,782 A | * | 10/1986 | Namatsu et al. | 204/192.36 |
| 5,981,398 A | * | 11/1999 | Tsai et al. | 438/710 |
| 2005/0049158 A1 | * | 3/2005 | Cai | 510/197 |
| 2006/0237881 A1 | * | 10/2006 | Guo et al. | 264/496 |

FOREIGN PATENT DOCUMENTS

| | | |
|---|---|---|
| JP | 2000-275820 | 10/2000 |
| JP | 2001-166490 | 6/2001 |
| JP | 2001-272797 | 10/2001 |
| JP | 2002-343767 | 11/2002 |
| JP | 2004-103872 | 4/2004 |
| JP | 2007-047580 | 2/2007 |
| JP | 2010-085893 | 4/2010 |
| JP | 2010-224554 | 10/2010 |
| WO | WO2004/001502 A1 | 12/2003 |
| WO | WO 2006/040956 | 4/2006 |
| WO | WO 2008/047715 | 4/2008 |
| WO | WO 2010/087233 | 8/2010 |

OTHER PUBLICATIONS

International Search Report for corresponding International Application No. PCT/JP2012/058270, Jun. 12, 2012.

* cited by examiner

*Primary Examiner* — Caleen Sullivan
(74) *Attorney, Agent, or Firm* — Oblon, Spivak, McClelland, Maier & Neustadt, L.L.P.

(57) ABSTRACT

A multilayer resist process pattern-forming method includes providing an inorganic film over a substrate. A protective film is provided on the inorganic film. A resist pattern is provided on the protective film. A pattern is provided on the substrate by etching that utilizes the resist pattern as a mask. A multilayer resist process inorganic film-forming composition includes a compound, an organic solvent, and a crosslinking accelerator. The compound includes a metal compound that includes a hydrolyzable group, a hydrolysate of a metal compound that includes a hydrolyzable group, a hydrolysis-condensation product of a metal compound that includes a hydrolyzable group, or a combination thereof. The compound includes at least one metal element belonging to Group 6, Group 12, or Group 13 of the Periodic Table of the Elements.

18 Claims, No Drawings

MULTILAYER RESIST PROCESS PATTERN-FORMING METHOD AND MULTILAYER RESIST PROCESS INORGANIC FILM-FORMING COMPOSITION

CROSS-REFERENCE TO RELATED APPLICATIONS

The present application is a continuation application of International Application No. PCT/JP2012/058270, filed Mar. 28, 2012, which claims priority to Japanese Patent Application No. 2011-076627, filed Mar. 30, 2011 and to Japanese Patent Application No. 2011-202480, filed Sep. 15, 2011. The contents of these applications are incorporated herein by reference in their entirety.

BACKGROUND OF THE INVENTION

1. Field of the Invention

The invention relates to a multilayer resist process pattern-forming method and a multilayer resist process inorganic film-forming composition.

2. Discussion of the Background

A reduction in processing size has progressed by utilizing a multilayer resist process in order to increase the degree of integration of semiconductor devices and the like. The multilayer resist process includes forming an inorganic film using an inorganic material, applying a resist composition to the inorganic film to form a resist film that differs in etching selectivity ratio from the inorganic film, transferring a mask pattern to the resist film via exposure, and developing the resist film using a developer to form a resist pattern. The resist pattern is then transferred to the inorganic film by dry etching, and the pattern of the inorganic film is transferred to the substrate to form the desired pattern on the substrate.

The thickness of the resist film used for the multilayer resist process has been increasingly reduced in order to more finely process the substrate. Therefore, an inorganic film that achieves a higher etching selectivity ratio has been desired, and use of a metal-containing inorganic film has been studied (see Japanese Patent Application Publication (KOKAI) No. 2000-275820, Japanese Patent Application Publication (KOKAI) No. 2002-343767, and WO2006/40956).

SUMMARY OF THE INVENTION

According to one aspect of the present invention, a multilayer resist process pattern-forming method includes providing an inorganic film over a substrate. A protective film is provided on the inorganic film. A resist pattern is provided on the protective film. A pattern is provided on the substrate by etching that utilizes the resist pattern as a mask.

According to another aspect of the present invention, a multilayer resist process inorganic film-forming composition includes a compound, an organic solvent, and a crosslinking accelerator. The compound includes a metal compound that includes a hydrolyzable group, a hydrolysate of a metal compound that includes a hydrolyzable group, a hydrolysis-condensation product of a metal compound that includes a hydrolyzable group, or a combination thereof. The compound includes at least one metal element belonging to Group 6, Group 12, or Group 13 of the Periodic Table of the Elements in an amount of 50 mol % or more based on a total amount of a metal element and a metalloid element included in the compound.

According to further aspect of the present invention, a multilayer resist process inorganic film-forming composition includes a compound and an organic solvent. The compound includes a metal complex that includes a hydrolyzable group, a hydrolysate of the metal complex that includes a hydrolyzable group, a hydrolysis-condensation product of the metal complex that includes a hydrolyzable group, or a combination thereof. The compound includes at least one metal element belonging to Group 3, Group 4, or Group 5 of the Periodic Table of the Elements. A content of the at least one metal element in the compound is 50 mol % or more based on a total amount of a metal element and a metalloid element included in the compound.

DESCRIPTION OF THE EMBODIMENTS

According to one embodiment of the invention, a multilayer resist process pattern-forming method includes:
(1) forming an inorganic film over a substrate (hereinafter may be referred to as "step (1)");
(2) forming a protective film on the inorganic film (hereinafter may be referred to as "step (2)");
(3) forming a resist pattern on the protective film (hereinafter may be referred to as "step (3)"); and
(4) forming a pattern on the substrate by etching that utilizes the resist pattern as a mask (hereinafter may be referred to as "step (4)").

It is considered that the pattern-forming method according to the embodiment of the invention can reduce contact between a developer and the inorganic film, and suppress migration of an elution metal from the inorganic film as a result of forming the protective film such as a non-metal film between the inorganic film and the resist film. This makes it possible to suppress elution of a metal from the inorganic film.

It is preferable that the pattern-forming method further include (0) forming a resist underlayer film on the substrate (hereinafter may be referred to as "step (0)"), and the step (1) include forming the inorganic film on the resist underlayer film.

In this case, the pattern-forming method makes it possible to form a finer pattern when implementing the multilayer resist process.

It is preferable that the step (3) include:
(3a) forming a resist film on the protective film using a resist composition (hereinafter may be referred to as "step (3a)");
(3b) exposing the resist film by applying radiation via a photomask (hereinafter may be referred to as "step (3b)"); and
(3c) developing the exposed resist film to form the resist pattern (hereinafter may be referred to as "step (3c)").

When the step (3) included in the pattern-forming method includes the above steps, it is possible to form a finer pattern.

It is also preferable that the step (3) include forming the resist pattern by nanoimprint lithography.

According to the pattern-forming method, a fine pattern can also be formed when forming the resist pattern by nanoimprint lithography.

It is preferable that the step (1) include forming the inorganic film using a composition that includes [A] at least one compound selected from the group consisting of a metal compound that includes a hydrolyzable group, a hydrolysate of a metal compound that includes a hydrolyzable group, and a hydrolysis-condensation product of a metal compound that includes a hydrolyzable group, and [B] an organic solvent.

It is possible to easily form the inorganic film, and improve the productivity of the multilayer resist process by forming the inorganic film using the above specific composition.

It is preferable that the compound [A] include at least one metal element selected from a group consisting of the group 3 elements, the group 4 elements, the group 5 elements, the group 6 elements, the group 12 elements, and the group 13 elements. When the compound [A] included in the composition used to form the inorganic film is a compound that includes the above specific metal element, it is possible to form a finer pattern from the viewpoint of the etching selectivity ratio.

It is preferable that the protective film be an organic film or a silicon-containing film. It is considered that diffusion of an alkaline developer and diffusion of a metal from the inorganic film can be effectively suppressed when the protective film is the above specific film. As a result, elution of a metal from the inorganic film can be further suppressed. Moreover, it is possible to form a resist pattern having an excellent pattern shape.

It is preferable that the silicon-containing film be formed using a composition that includes [a] a polysiloxane and [b] an organic solvent.

It is possible to easily form the silicon-containing film, and improve the productivity of the multilayer resist process by forming the silicon-containing film using the above composition.

It is preferable that the organic film have a carbon content of 45 mass % or more and less than 70 mass %. When the organic film has a carbon content within the above specific range, it is possible to more effectively transfer the desired resist pattern to the substrate, and further suppress elution of a metal from the inorganic film.

It is preferable that the silicon-containing film have a silicon content of 20 mass % or more. When the silicon-containing film has a silicon content within the above specific range, it is possible to provide etching selectivity with respect to the resist film, and more effectively transfer the desired resist pattern to the substrate.

It is preferable that the protective film have a thickness of 100 nm or less. When the protective film has a thickness within the above specific range, it is possible to transfer the desired resist pattern to the substrate while more effectively suppressing elution of a metal from the inorganic film.

According to another embodiment of the invention, a multilayer resist process inorganic film-forming composition includes:

[A1] at least one compound selected from a group consisting of a metal compound that includes a hydrolyzable group, a hydrolysate of a metal compound that includes a hydrolyzable group, and a hydrolysis-condensation product of a metal compound that includes a hydrolyzable group;

[B] an organic solvent; and

[D] a crosslinking accelerator, the compound [A1] including at least one metal element selected from the group consisting of the group 6 elements, the group 12 elements, and the group 13 elements (hereinafter may be referred to as "specific element (1)"), and the content of the at least one metal element selected from the group consisting of the group 6 elements, the group 12 elements, and the group 13 elements in the compound [A1] being 50 mol % or more based on the total amount of a metal element and a metalloid element included in the compound [A1] (hereinafter may be referred to as "inorganic film-forming composition (A)").

Since the inorganic film-forming composition (A) includes the compound [A1], has a content of the specific element (1) within the above specific range, and also includes the crosslinking accelerator [D], it is possible to increase the molecular weight of the compound [A1] by heating or the like, and improve the etching selectivity ratio of the inorganic film to the organic film.

It is preferable that the inorganic film-forming composition (A) further include [C] water. The inorganic film-forming reaction can be promoted by incorporating the water [C] in the inorganic film-forming composition (A).

According to another embodiment of the invention, a multilayer resist process inorganic film-forming composition includes:

[A2] at least one compound selected from a group consisting of a metal complex (I) that includes a hydrolyzable group, a hydrolysate of the metal complex (I) that includes a hydrolyzable group, and a hydrolysis-condensation product of the metal complex (I) that includes a hydrolyzable group; and

[B] an organic solvent, the compound [A2] including at least one metal element selected from the group consisting of the group 3 elements, the group 4 elements, and the group 5 elements (hereinafter may be referred to as "specific element (2)"), and the content of the at least one metal element selected from the group consisting of the group 3 elements, the group 4 elements, and the group 5 elements in the compound [A2] being 50 mol % or more based on the total amount of a metal element and a metalloid element included in the compound [A2] (hereinafter may be referred to as "inorganic film-forming composition (B)").

Since the inorganic film-forming composition (B) includes the compound [A2], and has a content of the specific element (2) within the above specific range, it is possible to improve the capability to form the resist pattern on the inorganic film, and improve the etching selectivity ratio of the inorganic film to the organic film.

It is preferable that the inorganic film-forming composition (B) further include [C] water. The inorganic film-forming reaction can be promoted by incorporating the water [C] in the inorganic film-forming composition (A).

It is preferable that the inorganic film-forming composition (B) further include [D] a crosslinking accelerator. When the inorganic film-forming composition (B) further includes the crosslinking accelerator [D], it is possible to increase the molecular weight of the compound [A2] by heating or the like, and improve the etching selectivity ratio of the inorganic film to the organic film.

The inorganic film-forming composition (A) and the inorganic film-forming composition (B) may suitably be used for the following pattern-forming method (hereinafter may be referred to as "pattern-forming method (I)") that is used for the multilayer resist process.

The pattern-forming method (I) includes:

(1) forming an inorganic film over a substrate using the inorganic film-forming composition (A) or the inorganic film-forming composition (B) (hereinafter may be referred to as "step (1)");

(2) forming a resist pattern on the inorganic film using a resist composition (hereinafter may be referred to as "step (2)");

(3) exposing the resist film by applying radiation via a photomask (hereinafter may be referred to as "step (3)");

(4) developing the exposed resist film to form the resist pattern (hereinafter may be referred to as "step (4)"); and (5) forming a pattern on the substrate by performing dry etching that utilizes the resist pattern as a mask once or a plurality of times (hereinafter may be referred to as "step (5)").

The pattern-forming method (I) that utilizes the inorganic film-forming composition (A) or the inorganic film-forming composition (B) can suppress a situation in which the resist pattern is lost, collapses, or curves, and accurately transfer the pattern even when forming a thin resist film. Therefore, the pattern-forming method (I) can suitably be used for a pattern-forming process that requires a reduced processing size.

It is preferable that the pattern-forming method (I) further include (O) forming a resist underlayer film on the substrate (hereinafter may be referred to as "step (0)"), and the step (1) include forming the inorganic film on the resist underlayer film. Since the inorganic film-forming composition (A) and the inorganic film-forming composition (B) ensure a high etching selectivity ratio for an organic material and an inorganic material, the resist pattern can be advantageously transferred by sequentially etching the inorganic film and the resist underlayer film that includes an organic film using a dry etching process.

It is preferable that the resist composition used in the step (2) included in the pattern-forming method (I) include [α] a polymer that includes an acid-labile group that dissociates due to an acid (hereinafter may be referred to as "polymer [α]"), and the step (4) include developing the exposed resist film using a developer that includes an organic solvent to form a negative resist pattern.

The above configuration makes it possible to suppress a situation in which the resist pattern undergoes a film thickness loss phenomenon. As a result, the pattern-forming method (I) can more accurately transfer the pattern.

The inorganic film-forming composition (A) and the inorganic film-forming composition (B) may also suitably be used for the following pattern-forming method (hereinafter may be referred to as "pattern-forming method (II)") that is used for the multilayer resist process.

The pattern-forming method (II) includes:
(1) forming an inorganic film over a substrate using the inorganic film-forming composition (A) or the inorganic film-forming composition (B) (hereinafter may be referred to as "step (1)");
(2') forming a resist pattern on the inorganic film by nanoimprint lithography (hereinafter may be referred to as "step (2')"); and
(5) forming a pattern on the substrate by performing dry etching that utilizes the resist pattern as a mask once or a plurality of times (hereinafter may be referred to as "step (5)").

It is preferable that the pattern-forming method (II) further include (0) forming a resist underlayer film on the substrate (hereinafter may be referred to as "step (0)"), and the step (1) include forming the inorganic film on the resist underlayer film.

According to the pattern-forming method (II), the pattern can be accurately transferred by forming the resist pattern by nanoimprint lithography.

The pattern-forming method can thus suppress elution of a metal from the inorganic film when implementing the multilayer resist process that utilizes the inorganic film. Therefore, it is possible to suppress occurrence of development defects and the like due to a metal eluted from the inorganic film, and reduce contamination of equipment due to a metal eluted from the inorganic film when forming a pattern using the multilayer resist process that utilizes the inorganic film. The embodiment can also provide a multilayer resist process inorganic film-forming composition that achieves an excellent resist pattern forming-capability and an excellent etching selectivity ratio. The multilayer resist process that utilizes the inorganic film-forming composition can suppress a situation in which the resist pattern is lost, collapses, or curves, and accurately transfer the pattern even when the thickness of the organic film is reduced. Therefore, the embodiments may suitably be applied to the production of an LSI (particularly formation of a fine contact hole) that will be further miniaturized in the future. The embodiments will now be described in detail.

Pattern-Forming Method

The pattern-forming method includes:
(1) forming an inorganic film over a substrate;
(2) forming a protective film on the inorganic film;
(3) forming a resist pattern on the protective film; and
(4) forming a pattern on the substrate by etching that utilizes the resist pattern as a mask.

According to the pattern-forming method, it is possible to suppress elution of a metal from the inorganic film when implementing the multilayer resist process that utilizes an inorganic film as a result of providing the step (2). Note that the term "multilayer resist process" used herein refers to a process that forms a plurality of layers, and etches each layer to form a pattern on a substrate. It is preferable to perform etching a plurality of times. Each step is described in detail below.

Step (1)

In the step (1), the inorganic film is formed over the substrate. The term "inorganic film" used herein refers to a film that includes a metal element, and has a metal element content of 50 mass % or more, and preferably 60 mass % or more. The inorganic film is not particularly limited as long as the inorganic film has the above properties. Examples of the inorganic film include a metal film, a metal oxide-containing film, a metal nitride-containing film, and the like.

Examples of the substrate include a wafer coated with an insulating film (e.g., silicon oxide, silicon nitride, silicon oxynitride, or polysiloxane) or a low-dielectric-constant insulating film (e.g., Black Diamond (manufactured by AMAT), SiLK (manufactured by Dow Chemical), or LKD5109 (manufactured by JSR Corporation)). Further examples of the substrate include polysilicon, a metal gate film obtained by implanting a metal component into polysilicon, and the like. A patterned substrate having a trench, a via, and the like may also be used.

The inorganic film may be formed by an arbitrary method. For example, the inorganic film may be formed by a method that applies an inorganic film-forming composition, a physical vapor deposition method (e.g., vacuum deposition), a CVD method (e.g., plasma CVD, thermal CVD, or atmospheric pressure CVD), a sputtering method, an ion plating method, or the like. Among these, it is preferable to use the method that applies the inorganic film-forming composition since the inorganic film can be easily formed.

When using the method that applies the inorganic film-forming composition, the inorganic film-forming composition is applied to the surface of the substrate to form a film of the inorganic film-forming composition, and the film is cured by heating while optionally applying UV light to obtain the inorganic film.

Inorganic Film-Forming Composition

The inorganic film-forming composition is not particularly limited as long as the inorganic film can be formed. It is preferable that the inorganic film-forming composition include [A] at least one compound selected from the group consisting of a metal compound that includes a hydrolyzable group, a hydrolysate of a metal compound that includes a hydrolyzable group, and a hydrolysis-condensation product of a metal compound that includes a hydrolyzable group (hereinafter may be referred to as "compound [A]"), and [B] an organic solvent, since the inorganic film can be easily formed, and the productivity of the multilayer resist process can be improved. The inorganic film-forming composition may preferably include [C] water and [D] a crosslinking accelerator. The inorganic film-forming composition may also include a surfactant and the like.

Compound [A]

The compound [A] is at least one compound selected from the group consisting of a metal compound that includes a hydrolyzable group, a hydrolysate of a metal compound that includes a hydrolyzable group, and a hydrolysis-condensation product of a metal compound that includes a hydrolyzable group.

The compound [A] may include an arbitrary metal element. It is preferable that the compound [A] include at least one metal element selected from the group consisting of the group 3 elements, the group 4 elements, the group 5 elements, the group 6 elements, the group 12 elements, and the group 13 elements (hereinafter may be referred to as "specific element") from the viewpoint of the etching selectivity ratio.

Examples of the specific element include group 3 elements such as Sc (scandium) and Y (yttrium); group 4 elements such as Ti (titanium), Zr (zirconium), and Hf (hafnium); group 5 elements such as V (vanadium), Nb (niobium), and Ta (tantalum); group 6 elements such as Cr (chromium), Mo (molybdenum), and W (tungsten); group 12 elements such as Zn; and group 13 elements such as Al (aluminum), Ga (gallium), In (indium), and Tl (thallium).

Among these, zirconium, hafnium, tungsten, aluminum, vanadium, and titanium are preferable, and zirconium is more preferable.

The metal compound that includes a hydrolyzable group that may be used as the compound [A] is preferably a metal alkoxide, a metal carboxylate, or a metal complex.

Metal Alkoxide

The term "metal alkoxide" used herein refers to a compound obtained by substituting the hydrogen atom of the hydroxyl group of an alcohol with a metal atom. The metal alkoxide is represented by the following formula (1).

$$M(OR^1)_a \qquad (1)$$

wherein M is the specific element (atom), a is an integer from 1 to 7 that corresponds to the valency of the specific element M, and $R^1$ is an alkyl group having 1 to 10 carbon atoms or a cycloalkyl group having 3 to 10 carbon atoms that is substituted with an alkoxy group, or unsubstituted, provided that a plurality of $R^1$ are either identical or different when a plurality of $R^1$ are present.

A compound represented by the following formula (2) is preferable as the alcohol, for example.

$$R^2OH \qquad (2)$$

wherein $R^2$ is the same as defined for $R^1$ in the formula (1).

Examples of the compound represented by the formula (2) when $R^2$ is an alkyl group or a cycloalkyl group include methanol, ethanol, 1-propanol, 2-propanol, n-butanol, sec-butanol, pentanol, cyclohexanol, and the like. Examples of the compound represented by the formula (2) when $R^2$ is an alkyl group or a cycloalkyl group that is substituted with an alkoxy group include methoxymethanol, methoxyethanol, ethoxymethanol, ethoxyethanol, methoxypropanol, ethoxypropanol, propoxypropanol, and the like.

Metal Carboxylate

The term "metal carboxylate" used herein refers to a compound obtained by substituting the hydrogen atom of the carboxyl group of a carboxylic acid with the specific element. The metal carboxylate is represented by the following formula (3).

$$M(OCOR^3)_a \qquad (3)$$

wherein M and a are the same as defined for the formula (1), and $R^3$ is an organic group, provided that a plurality of $R^3$ are either identical or different when a plurality of $R^3$ are present.

A compound represented by the following formula (4) is preferable as the carboxylic acid, for example.

$$R^4COOH \qquad (4)$$

wherein $R^4$ is the same as defined for $R^3$ in the formula (3).

Examples of the compound represented by the formula (4) include acetic acid, trifluoroacetic acid, 2-methylpropanoic acid, pentanoic acid, 2,2-dimethylpropanoic acid, butanoic acid, hexanoic acid, 2-ethylhexanoic acid, octanoic acid, nonanoic acid, decanoic acid, acrylic acid, methacrylic acid, salicylic acid, and the like.

Metal Complex

The term "metal complex" used herein refers to a compound in which a hydrolyzable group is bonded to the specific element (atom). The metal complex is represented by the following formula (5), for example.

$$M(OR^1)_b(OCOR^3)_cR^5_d \qquad (5)$$

wherein M and $R^1$ are the same as defined for the formula (1), $R^3$ is the same as defined for the formula (3), b and c are independently an integer from 0 to 7, provided that b+c corresponds to the valency of the specific element M, d is an integer from 0 to 7, and $R^5$ is an organic compound, provided that a plurality of $R^5$ are either identical or different when a plurality of $R^5$ are present.

Examples of the organic compound represented by $R^5$ include an ether represented by the following formula (6).

$$R^6OR^7 \qquad (6)$$

wherein $R^6$ and $R^7$ are a saturated or unsaturated hydrocarbon group having 1 to 10 carbon atoms that may include an oxygen atom in the skeletal chain, provided that $R^6$ and $R^7$ optionally bond to each other to form a cyclic structure.

Examples of the ether represented by the formula (6) include methylal, diethyl ether, dipropyl ether, dibutyl ether, diamyl ether, diethyl acetal, dihexyl ether, trioxane, dioxane, and the like.

Further examples of the organic compound represented by $R^5$ include a ketone represented by the following formula (7) or (8), and the like.

$$R^8R^9C=O \qquad (7)$$

$$R^{10}(C=O)CH_2(C=O)R^{11} \qquad (8)$$

wherein $R^8$ and $R^{10}$ are independently a saturated or unsaturated hydrocarbon group having 1 to 10 carbon atoms that may include a keto group m in the skeletal chain, and $R^9$ and $R^{11}$ are independently a saturated or unsaturated hydrocarbon group having 1 to 10 carbon atoms.

Examples of the ketone represented by the formula (7) or (8) include methyl ethyl ketone, methyl propyl ketone, methyl isobutyl ketone, methyl amyl ketone, methyl cyclohexyl ketone, diethyl ketone, ethyl butyl ketone, trimethylnonanone, acetonylacetone, mesityl oxide, cyclohexanone, diacetone alcohol (4-hydroxy-4-methyl-2-pentanone), acetylacetone (2,4-pentanedione), 2,4-trifluoropentanedione, 2,4-hexafluoropentanedione, ethyl acetoacetate, 2,2,6,6-tetramethyl-3,5-heptanedione, 1,3-diphenyl-1,3-propanedione, 1-phenyl-1,3-butanedione, and the like.

Further examples of the organic compound represented by $R^5$ include an ester represented by the following formula (9).

$$R^{14}COOR^{15} \qquad (9)$$

wherein $R^{14}$ is a saturated or unsaturated hydrocarbon group having 1 to 10 carbon atoms that may include a keto group, a hydroxyl group, or an alkoxy group, and $R^{15}$ is a saturated or unsaturated hydrocarbon group having 1 to 10 carbon atoms that may include an alkoxy group.

Examples of the ester represented by the formula (9) include ethyl formate, methyl acetate, ethyl acetate, butyl acetate, cyclohexyl acetate, methyl propionate, ethyl butyrate, ethyl oxyisobutyrate, ethyl acetoacetate, ethyl lactate, methoxybutyl acetate, diethyl oxalate, diethyl malonate, and the like.

The hydrolysate is obtained by hydrolyzing the metal compound that includes a hydrolyzable group, and the hydrolysis-condensation product is obtained by condensing the hydrolysate. The metal compound that includes a hydrolyzable group is hydrolyzed by adding water, or water and a catalyst, to the metal compound that includes a hydrolyzable group, and stirring the mixture at 20 to 100° C. for several hours to several days. Water is normally used in an amount of 100 mol or less, and preferably 5 to 50 mol, based on 100 mol of the metal compound that includes a hydrolyzable group. Examples of the catalyst include acid catalysts such as inorganic acids (e.g., hydrochloric acid, sulfuric acid, and nitric acid) and organic acids (e.g., acetic acid, propionic acid, butyric acid, and maleic acid), inorganic or organic alkali catalysts such as sodium hydroxide, potassium hydroxide, ammonia, monoethanolamine, diethanolamine, and tetramethylammonium hydroxide, and the like.

Organic solvent [B]

Examples of the organic solvent [B] include alcohol-based solvents, ketone-based solvents, amide-based solvents, ether-based solvents, ester-based solvents, a mixed solvent thereof, and the like. These solvents may be used either alone or in combination.

Examples of the alcohol-based solvents include monohydric alcohol-based solvents such as methanol, ethanol, n-propanol, iso-propanol, n-butanol, iso-butanol, sec-butanol, tert-butanol, n-pentanol, iso-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohol-based solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol ether-based solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropyleneglycol monomethylether, dipropylene glycol monoethyl ether, and dipropylene glycol monopropyl ether; and the like.

Examples of the ketone-based solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonane, cyclopentanone, cyclohexanone, cycloheptanone, cyclooctanone, methylcyclohexanone, 2,4-pentanedione, acetonylacetone, diacetone alcohol, acetophenone, and the like.

Examples of the amide-based solvents include N,N'-dimethylimidazolidinone, N-methylformamide, N,N-dimethylformamide, N,N-diethylformamide, acetamide, N-methylacetamide, N,N-dimethylacetamide, N-methylpropioneamide, N-methylpyrrolidone, and the like.

Examples of the ester-based solvents include diethyl carbonate, propylene carbonate, methyl acetate, ethyl acetate, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Among these, propylene glycol monomethyl ether and propylene glycol monoethyl ether are preferable.

The content of the organic solvent [B] is preferably determined so that the content of the compound [A] in the inorganic film-forming composition is 0.5 to 20 mass %, and preferably 0.5 to 15 mass % (based on metal oxide).

Water [C]

It is preferable that the inorganic film-forming composition further include the water [C]. The inorganic film-forming reaction can be promoted by incorporating the water [C] in the inorganic film-forming composition. The water [C] is not particularly limited. Examples of the water [C] include distilled water, ion-exchanged water, and the like. The water [C] is preferably used in an amount of 0.1 to 10 parts by mass, and more preferably 1 to 8 parts by mass, based on 100 parts by mass of the inorganic film-forming composition.

Crosslinking Accelerator [D]

It is preferable that the inorganic film-forming composition further include the crosslinking accelerator [D]. The crosslinking accelerator [D] is a compound that generates an acid or a base due to light or heat. When the inorganic film-forming composition further includes the crosslinking accelerator [D], the etching selectivity ratio of the inorganic film can be improved. Examples of the crosslinking accelerator [D] include onium salt compounds, sulfonimide compounds, and the like. It is preferable that the crosslinking accelerator [D] be a thermal crosslinking accelerator that generates an acid or a base due to heat. It is preferable that the crosslinking accelerator [D] be an onium salt compound.

Examples of the onium salt compounds include sulfonium salts (including tetrahydrothiophenium salts), iodonium salts, ammonium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, triphenylphosphonium 1,1,2,2-tetrafluoro-6-(1-adamantanecarbonyloxy)hexane-1-sulfonate, and the like.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like.

Examples of the iodonium salts include diphenyliodonium trifluoromethanesulfonate, diphenyliodonium nona fluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like.

Examples of the ammonium salts include ammonium formate, ammonium maleate, ammonium fumarate, ammonium phthalate, ammonium malonate, ammonium succinate, ammonium tartrate, ammonium malate, ammonium lactate, ammonium citrate, ammonium acetate, ammonium propionate, ammonium butanoate, ammonium pentanoate, ammonium hexanoate, ammonium heptanoate, ammonium octanoate, ammonium nonanoate, ammonium decanoate, ammonium oxalate, ammonium adipate, ammonium sebacate, ammonium butyrate, ammonium oleate, ammonium stearate, ammonium linoleate, ammonium linolenate, ammonium salicylate, ammonium benzenesulfonate, ammonium benzoate, ammonium p-aminobenzoate, ammonium p-toluenesulfonate, ammonium methanesulfonate, ammonium trifluoromethanesulfonate, ammonium trifluoroethanesulfonate, and the like. Further examples of the ammonium salts include ammonium salts obtained by substituting the ammonium ion of the above ammonium salts with a methylammonium ion, a dimethylammonium ion, a trimethylammonium ion, a tetramethylammonium ion, an ethylammonium ion, a diethylammonium ion, a triethylammonium ion, a tetraethylammonium ion, a propylammonium ion, a dipropylammonium ion, a tripropylammonium ion, a tetrapropylammonium ion, a butylammonium ion, a dibutylammonium ion, a tributylammonium ion, a tetrabutylammonium ion, a trim ethylethylammonium ion, a dimethyldiethylammonium ion, a dimethylethylpropylammonium ion, a methylethylpropylbutylammonium ion, an ethanolammonium ion, a diethanolammonium ion, a triethanolammonium ion, or the like. Still further examples of the ammonium salts include 1,8-diazabicyclo[5,4,0]undec-7-ene salts, 1,5-diazabicyclo[4.3.0]-5-nonene salts, and the like. Examples of the 1,8-diazabicyclo[5,4,0]undec-7-ene salts include 1,8-diazabicyclo[5,4,0]undec-7-ene formate, 1,8-diazabicyclo[5,4,0]undec-7-ene p-toluenesulfonate, and the like.

Examples of N-sulfonyloxyimide compounds include N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3-dicarboxylmide, and the like.

Among these, diphenyliodonium trifluoromethanesulfonate, diphenyliodonium nonafluoro-n-butanesulfonate, diphenyliodonium perfluoro-n-octanesulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, tetraalkylammonium salts, and 1,8-diazabicyclo[5,4,0]undec-7-ene salts are preferable.

These crosslinking accelerators [D] may be used either alone or in combination. The crosslinking accelerator [D] is preferably used in an amount of 10 parts by mass or less, and more preferably 0.1 to 5 parts by mass, based on 100 parts by mass of the compound [A]. When the amount of the crosslinking accelerator [D] is within the above range, the etching selectivity ratio of the inorganic film can be improved.

Surfactant

The surfactant improves the applicability, striation, and the like of the inorganic film-forming composition. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate, and the like. Examples of a commercially available product of the surfactant include KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like.

These surfactants may be used either alone or in combination. The surfactant may be used in an appropriate amount depending on the objective.

The inorganic film-forming composition is prepared by dissolving or dispersing the compound [A], the water [C] (optional), the crosslinking accelerator [D] (optional), and an optional additional component in the organic solvent [B], and filtering the solution or dispersion through a filter having a pore size of about 0.2 for example.

The inorganic film-forming composition may be applied by spin coating, roll coating, dip coating, or the like. The heating temperature is normally 150 to 500° C., and preferably 180 to 350° C. The heating time is normally 30 to 1200 seconds, and preferably 45 to 600 seconds. The applied inorganic film-forming composition may be exposed to UV light. The thickness of the inorganic film is normally about 5 to about 50 nm.
Step (2)

In the step (2), the protective film is formed on the inorganic film. The protective film is normally a non-metal film. The term "non-metal film" used herein refers to a film that substantially includes only non-metal elements, and preferably has a non-metal element content of 95 mass % or more, and more preferably 99 mass % or more. The protective film is not particularly limited, but is preferably an organic film or a silicon-containing film.
Organic Film Examples of the organic film include films formed of an acrylic resin, a cyclic olefin resin, a copolymer resin or a polymer blend thereof, or the like.

The etching rate of the organic film must be higher than that of the resist film from the viewpoint of etching using the resist film. If the etching rate is too high, it may be difficult to control the etching process. The carbon content in the organic film that determines the etching rate is preferably 45 mass % or more and less than 70 mass %, and more preferably 50 mass % or more and less than 65 mass %.

The organic film may be formed by an arbitrary method. The organic film may be formed by a method that applies an organic film-forming composition that includes a resin, an organic solvent, and the like, a method that applies a molten resin, or the like. It is preferable to use the method that applies the organic film-forming composition since the organic film can be easily formed, and the productivity of the multilayer resist process can be improved.
Silicon-Containing Film The term "silicon-containing film" used herein refers to a film that mainly includes a silicon atom, and preferably has a silicon content of 20 mass % or more, and more preferably 30 mass % or more.

Examples of the silicon-containing film include a silicon oxide film, a silicon nitride film, a silicon oxynitride film, a silicon carbide film, a polycrystalline silicon film, and the like.

It is preferable that the silicon-containing film have a silicon content of 20 mass % or more, more preferably 30 mass % or more, and still more preferably 40 mass % or more. When the silicon-containing film has a silicon content within the above range, it is possible to provide etching selectivity with respect to the resist film, and more effectively transfer the desired resist pattern to the substrate.

The silicon-containing film may be formed by a method that applies a silicon-containing film-forming composition, a physical vapor deposition method (e.g., vacuum deposition), a CVD method (e.g., plasma CVD, thermal CVD, or atmospheric pressure CVD), a sputtering method, an ion plating method, or the like. Among these, it is preferable to employ the method that applies the silicon-containing film-forming composition since the silicon-containing film can be easily formed.

When using the method that applies the silicon-containing film-forming composition, the silicon-containing film-forming composition is applied to the surface of the inorganic film to form a film of the silicon-containing film-forming composition, and the film is cured by heating while optionally applying UV light to obtain the silicon-containing film.

Examples of the silicon-containing film-forming composition include a composition that includes [a] a polysiloxane and [b] an organic solvent, and the like.
Polysiloxane [a]

The polysiloxane [a] is not particularly limited as long as the polysiloxane [a] is a polymer that includes a siloxane bond, but is preferably a hydrolysis-condensation product of a silane compound represented by the following formula (1). The polysiloxane [a] may be synthesized using only one type of silane compound, or may be synthesized using two or more types of silane compound.

$$R^A{}_a SiX_{4-a} \qquad (i)$$

wherein $R^A$ is a hydrogen atom, a fluorine atom, an alkyl group having 1 to 5 carbon atoms, an alkenyl group, an aryl group, or a cyano group, provided that some or all of the hydrogen atoms of the alkyl group may be substituted with a glycidyloxy group, an oxetanyl group, an acid anhydride group, or a cyano group, and some or all of the hydrogen atoms of the aryl group may be substituted with a hydroxyl group, X is a halogen atom or —$OR^B$, $R^B$ is a monovalent organic group, and a is an integer from 0 to 3, provided that a plurality of $R^A$ are either identical or different when a plurality of $R^A$ are present, and a plurality of X are either identical or different when a plurality of X are present.

Examples of the alkyl group having 1 to 5 carbon atoms represented by $R^A$ include linear alkyl groups such as a methyl group, an ethyl group, an n-propyl group, an n-butyl group, and an n-pentyl group; branched alkyl groups such as an isopropyl group, an isobutyl group, a sec-butyl group, a t-butyl group, and an isoamyl group; and the like.

Examples of the alkenyl group represented by $R^A$ include a group obtained by removing one hydrogen atom from an alkene compound, and the like. Specific examples of the alkenyl group include an ethenyl group, a 1-propen-1-yl group, a 1-propen-2-yl group, a 1-propen-3-yl group, a 1-buten-1-yl group, a 1-buten-2-yl group, a 1-buten-3-yl group, a 1-buten-4-yl group, a 2-buten-1-yl group, a 2-buten-2-yl group, a 1-penten-5-yl group, a 2-penten-1-yl group, a 2-penten-2-yl group, a 1-hexen-6-yl group, a 2-hexen-1-yl group, a 2-hexen-2-yl group, and the like. Among these, a group represented by the following formula (i-1) is preferable.

$$CH_2=CH+(CH_2)_n-* \qquad (i-1)$$

wherein n is an integer from 0 to 4, and * is a bonding site.

n is preferably 0 or 1, and more preferably 0 (i.e., vinyl group).

Examples of the aryl group represented by $R^A$ include a phenyl group, a naphthyl group, a methylphenyl group, an ethylphenyl group, a chlorophenyl group, a bromophenyl group, a fluorophenyl group, and the like.

Examples of the acid anhydride group that may substitute the alkyl group include a succinic anhydride group, a maleic anhydride group, a glutaric anhydride group, and the like.

Examples of the alkyl group substituted with a glycidyloxy group include a 2-glycidyloxyethyl group, a 3-glycidyloxypropyl group, a 4-glycidyloxybutyl group, and the like. Among these, a 3-glycidyloxypropyl group is preferable.

Examples of the alkyl group substituted with an oxetanyl group include a 3-ethyl-3-oxetanylpropyl group, a 3-methyl-3-oxetanylpropyl group, a 3-ethyl-2-oxetanylpropyl group, a 2-oxetanylethyl group, and the like. Among these, a 3-ethyl-3-oxetanylpropyl group is preferable.

Examples of the alkyl group substituted with an acid anhydride group include a 2-succinic anhydride group-substituted ethyl group, a 3-succinic anhydride group-substituted propyl group, a 4-succinic anhydride group-substituted butyl group, and the like. Among these, a 3-succinic anhydride group-substituted propyl group is preferable.

Examples of the alkyl group substituted with a cyano group include a 2-cyanoethyl group, a 3-cyanopropyl group, a 4-cyanobutyl group, and the like.

Examples of the aryl group substituted with a hydroxyl group include a 4-hydroxyphenyl group, a 4-hydroxy-2-methylphenyl group, a 4-hydroxynaphthyl group, and the like. Among these, a 4-hydroxyphenyl group is preferable.

Examples of the halogen atom represented by X include a fluorine atom, a chlorine atom, a bromine atom, an iodine atom, and the like.

Examples of the monovalent organic group represented by $R^B$ include an alkyl group, an alkylcarbonyl group, and the like. A methyl group, an ethyl group, an n-propyl group, an isopropyl group, an n-butyl group, an isobutyl group, a sec-butyl group, and a t-butyl group are preferable as the alkyl group. A methylcarbonyl group and an ethylcarbonyl group are preferable as the alkylcarbonyl group.

a is preferably an integer from 0 to 2, and more preferably 1 or 2.

Specific examples of the silane compound represented by the formula (1) include aromatic ring-containing trialkoxysilanes such as phenyltrimethoxysilane, benzyltrimethoxysilane, phenethyltrimethoxysilane, 4-methylphenyltrimethoxysilane, 4-ethylphenyltrimethoxysilane, 4-methoxyphenyltrimethoxysilane, 4-phenoxyphenyltrimethoxysilane, 4-hydroxyphenyltrimethoxysilane, 4-aminophenyltrimethoxysilane, 4-dimethylaminophenyltrimethoxysilane, 4-acetylaminophenyltrimethoxysilane, 3-methylphenyltrimethoxysilane, 3-ethylphenyltrimethoxysilane, 3-methoxyphenyltrimethoxysilane, 3-phenoxyphenyltrimethoxysilane, 3-hydroxyphenyltrimethoxysilane, 3-aminophenyltrimethoxysilane, 3-dimethylaminophenyltrimethoxysilane, 3-acetylaminophenyltrimethoxysilane, 2-methylphenyltrimethoxysilane, 2-ethylphenyltrimethoxysilane, 2-methoxyphenyltrimethoxysilane, 2-phenoxyphenyltrimethoxysilane, 2-hydroxyphenyltrimethoxysilane, 2-aminophenyltrimethoxysilane, 2-dimethylaminophenyltrimethoxysilane, 2-acetylaminophenyltrimethoxysilane, 2,4,6-trimethylphenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane, and 4-acetylaminobenzyltrimethoxysilane; alkyltrialkoxysilanes such as methyltrimethoxysilane, methyltriethoxysilane, methyltri-n-propoxysilane, methyltriisopropoxysilane, methyltri-n-butoxysilane, methyltri-sec-butoxysilane, methyltri-t-butoxysilane, methyltriphenoxysilane, methyltriacetoxysilane, methyltrichlorosilane, methyltriisopropenoxysilane, methyltris(dimethylsiloxy)silane, methyltris(methoxyethoxy)silane, methyltris(methylethylketoxime)silane, methyltris(trimethylsiloxy)silane, methylsilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-t-butoxysilane, ethyltriphenoxysilane, ethylbistris(trimethylsiloxy)silane, ethyldichlorosilane, ethyltriacetoxysilane, ethyltrichlorosilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-t-butoxysilane, n-propyltriphenoxysilane, n-propyltriacetoxysilane, n-propyltrichlorosilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-t-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-t-butoxysilane, n-butyltriphenoxysilane, n-butyltrichlorosilane, 2-methylpropyltrimethoxysilane, 2-methylpropyltriethoxysilane, 2-methylpropyltri-n-propoxysilane, 2-methylpropyltriisopropoxysilane, 2-methylpropyltri-n-butoxysilane, 2-methylpropyltri-sec-butoxysilane, 2-methylpropyltri-t-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltriisopropoxysilane, 1-methylpropyltri-n-butoxysilane, 1-methylpropyltri-sec-butoxysilane, 1-methylpropyltri-t-butoxysilane, 1-methylpropyltriphenoxysilane, t-butyltrimethoxysilane, t-butyltriethoxysilane, t-butyltri-n-propoxysilane, t-butyltriisopropoxysilane, t-butyltri-n-butoxysilane, t-butyltri-sec-butoxysilane, t-butyltri-t-butoxysilane, t-butyltriphenoxysilane, t-butyltrichlorosilane, and t-butyldichlorosilane; alkenyltrialkoxysilanes such as vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-t-butoxysilane, vinyltriphenoxysilane, allyltrimethoxysilane, allyltriethoxysilane, allyltri-n-propoxysilane, allyltriisopropoxysilane, allyltri-n-butoxysilane, allyltri-sec-butoxysilane, allyltri-t-butoxysilane, and allyltriphenoxysilane; tetraalkoxysilanes such as tetramethoxysilane, tetraethoxysilane, tetra-n-propoxysilane, tetraisopropoxysilane, tetra-n-butoxysilane, tetra-sec-butoxysilane, and tetra-t-butoxysilane; tetraarylsilanes such as tetraphenoxysilane; epoxy group-containing silanes such as oxetanyltrimethoxysilane, oxiranyltrimethoxysilane, oxiranylmethyltrimethoxysilane, and 3-glycidyloxypropyltrimethoxysilane; acid anhydride group-containing silanes such as 3-(trimethoxysilyl)propylsuccinic anhydride, 2-(trimethoxysilyl)ethylsuccinic anhydride, 3-(trimethoxysilyl)propylmaleic anhydride, and 2-(trimethoxysilyl)ethylglutaric anhydride; tetrahalosilanes such as tetrachlorosilane; and the like.

Among these, tetramethoxysilane, tetraethoxysilane, and phenyltrimethoxysilane are preferable since the resulting silicon-containing film exhibits excellent dry etching resistance.

The polysiloxane [a] may be synthesized using an additional silane compound in addition to the silane compound represented by the formula (1). Examples of the additional silane compound include disilanes such as hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldi silane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trim ethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2- triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, bis(trimethoxysilyl)methane, bis(triethoxysilyl)methane, bis(tri-n-propoxysilyl)methane, bis(tri-iso-propoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-iso-propoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-iso-propoxymethylsilyl)-1-(tri-iso-propoxysilyl)methane, 1-(di-n-butoxymethylsilyl)-1-(tri-n-butoxysilyl)methane, 1-(di-sec-butoxymethylsilyl)-1-(tri-sec-butoxysilyemethane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-iso-propoxymethylsilyl)-2-(tri-iso-propoxysilyl)ethane, 1-(di-n-butoxymethylsilyl)-2-(tri-n-butoxysilyl)ethane, 1-(di-sec-butoxysilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyeethane, 1,2-bis(di-sec-butoxymethylsilyeethane, 1,2-bis(di-t-butoxymethylsilyl)ethane, bis(dimethylmethoxysilyl)methane, bis(dimethylethoxysilyl)methane, bis(dimethyl-n-propoxysilyl)methane, bis(dimethylisopropoxysilyl)methane, bis(dimethyl-n-butoxysilyl)methane, bis(dimethyl-sec-butoxysilyl)methane, bis(dimethyl-t-butoxysilyl)methane, 1,2-bis(dimethylmethoxysilyl)ethane, 1,2-bis(dimethylethoxysilyl)ethane, 1,2-bis(dimethyl-n-propoxysilyl)ethane, 1,2-bis(dimethylisopropoxysilyl)ethane, 1,2-bis(dimethyl-n-butoxysilyl)ethane, 1,2-bis(dimethyl-sec-butoxysilyl)ethane, 1,2-bis(dimethyl-t-butoxysilyl)ethane, 1-(dimethoxymethylsilyl)-1-(trimethylsilyl)methane, 1-(diethoxymethylsilyl)-1-(trimethylsilyl)methane, 1-(di-n-propoxymethylsilyl)-1-(trimethylsilyl)methane, 1-(di-iso-propoxymethylsilyl)-1-(trimethylsilyl)methane, 1-(di-n-butoxymethylsilyl)-1-(trimethylsilyl)methane, 1-(di-sec-butoxymethylsilyl)-1-(trimethylsilyl)methane, 1-(di-t-butoxymethylsilyl)-1-(trimethylsilyl)methane, 1-(dimethoxymethylsilyl)-2-(trimethylsilyl)ethane, 1-(diethoxymethylsilyl)-2-(trimethylsilyl)ethane, 1-(di-n-propoxymethylsilyl)-2-(trimethylsilyl)ethane, 1-(di-iso-propoxymethylsilyl)-2-(trimethylsilyl)ethane, 1-(di-n-butoxymethylsilyl)-2-(trimethylsilyl)ethane, 1-(di-sec-butoxymethylsilyl)-2-(trimethylsilyl)ethane, 1-(di-t-butoxymethylsilyl)-2-(trimethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-iso-propoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-iso-propoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-iso-propoxysilyl)benzene, 1,4-bis(tri-n-butoxysilyl)benzene, 1,4-bis(tri-sec-butoxysilyl)benzene, and 1,4-bis(tri-t-butoxysilyl)benzene; polycarbosilanes such as polydimethoxymethylcarbosilane or polydiethoxymethylcarbosilane; and the like.

The content of the polysiloxane [a] in the silicon-containing film-forming composition is preferably 80 mass % or more, more preferably 90 mass % or more, and still more preferably 95 mass % or more, based on the total solid content in the silicon-containing film-forming composition. The silicon-containing film-forming composition may include only one type of the polysiloxane [a], or may include two or more types of the polysiloxane [a].

The polystyrene-reduced weight average molecular weight (Mw) of the polysiloxane [a] determined by gel permeation chromatography (GPC) is normally 500 to 50,000, preferably 1000 to 30,000, and more preferably 1000 to 15,000.

The thickness of the protective film is preferably 10 nm or less, more preferably 10 to 80 nm, and still more preferably 20 to 60 nm. When the protective film has a thickness within the above range, it is possible to transfer the desired resist pattern to the substrate while more effectively suppressing elution of a metal from the inorganic film.

Step (3)

In the step (3), the resist pattern is formed on the protective film. It is preferable that the step (3) include (3a) forming a resist film on the protective film using a resist composition, (3b) exposing the resist film by applying radiation via a photomask, and (3c) developing the exposed resist film to form the resist pattern. Each step is described in detail below.

Steps (3a) to (3c)

In the steps (3a) to (3c), the resist composition is applied to the protective film, and the resulting resist film is exposed and developed to form the resist pattern. Examples of the resist composition include a positive-tone or negative-tone chemically-amplified resist composition that includes a photoacid generator, a positive-tone resist composition that includes an alkali-soluble resin and a quinondiazide-based photosensitizer, a negative-tone resist composition that includes an alkali-soluble resin and a crosslinking agent, and the like. A commercially available resist composition may be used as the resist composition used for the pattern-forming method. The resist composition may be applied by spin coating or the like. The amount of the resist composition applied is adjusted so that the resulting resist film has the desired thickness.

The resist film may be formed by applying the resist composition to form a film, and prebaking the film to volatilize a solvent (i.e., a solvent included in the resist composition) from the film. The prebaking temperature is appropriately selected depending on the type of the resist composition and the like. The prebaking temperature is preferably 30 to 200° C., and more preferably 50 to 150° C. The prebaking time is normally 30 to 200 seconds, and preferably 45 to 120 seconds. Note that an additional film may be formed on the surface of the resist film. The thickness of the resist film is normally 1 to 500 nm, and preferably 10 to 300 nm.

The resist film is then exposed by selectively applying radiation to the resist film via a photomask. The exposure light is appropriately selected from electromagnetic waves such as visible rays, ultraviolet rays, deep ultraviolet rays, X-rays, and γ-rays, and particle beams such as electron beams, molecular beams, and ion beams depending on the type of acid generator included in the resist composition. It is preferable to use deep ultraviolet rays. It is more preferable to use KrF excimer laser light (wavelength: 248 nm), ArF excimer laser light (wavelength: 193 nm), $F_2$ excimer laser light (wavelength: 157 nm), $Kr_2$ excimer laser light (wavelength: 147 nm), ArKr excimer laser light (wavelength: 134 nm), or EUV light (wavelength: 13 nm, for example). Liquid immersion lithography may also be employed. Note that an immersion upper layer film may be formed on the resist film using an immersion upper layer film-forming composition.

It is preferable to subject the exposed resist film to post-exposure bake (PEB) in order to improve the resolution, the pattern profile, the developability, and the like of the resist film. The PEB temperature is appropriately adjusted depending on the type of the resist composition and the like. The PEB temperature is preferably 180° C. or less, and more preferably 150° C. or less. The PEB time is normally 30 to 200 seconds, and preferably 45 to 120 seconds.

The resist film is then developed to form the resist pattern. A developer used for development may be appropriately selected depending on the type of the resist composition. When the resist composition is a positive-tone chemically-amplified resist composition or a positive-tone resist composition that includes an alkali-soluble resin, an alkaline aqueous solution prepared by dissolving sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like in water may be used as the developer. An appropriate amount of a water-soluble organic solvent, an alcohol (e.g., methanol or ethanol), or a surfactant may be added to the alkaline aqueous solution.

When the resist composition is a negative-tone chemically-amplified resist composition or a negative-tone resist composition that includes an alkali-soluble resin, an aqueous solution prepared by dissolving an alkali (e.g., inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide, and choline, and cyclic amines such as pyrrole and piperidine) in water may be used as the developer.

It is also preferable that the step (3) include forming the resist pattern by nanoimprint lithography. The step that forms the resist pattern by nanoimprint lithography is described in detail below.

In this step, the resist pattern is formed on the protective film by nanoimprint lithography. The resist pattern may be formed using a radiation-sensitive curable composition, for example. Specifically, the nanoimprint lithography includes applying the radiation-sensitive curable composition to the substrate on which the protective film is formed in the step (2) to form a pattern-forming layer, hydrophobizing the surface of a mold having an inverted pattern, bringing the hydrophobized surface of the mold into pressure contact with the pattern-forming layer, exposing the pattern-forming layer in a state in which the mold is brought into pressure contact with the pattern-forming layer, and removing the mold from the exposed pattern-forming layer.

The radiation-sensitive curable composition may include a curing accelerator and the like. Examples of the curing accelerator include a photocuring accelerator and a heat-curing accelerator. It is preferable to use the photocuring accelerator. The photocuring accelerator may be appropriately selected depending on the structural unit included in the nanoimprint radiation-sensitive composition. For example, a photoacid generator, a photobase generator, a photosensitizer, or the like may be used as the photocuring accelerator. These photocuring accelerators may be used in combination.

The radiation-sensitive curable composition may be applied by an inkjet method, a dip coating method, an air knife coating method, a curtain coating method, a wire bar coating method, a gravure coating method, an extrusion coating method, a spin coating method, a slit scan method, or the like.

The surface of the mold having the inverted pattern is hydrophobized using a release agent or the like. The mold must be formed of an optically-transparent material. Examples of the optically-transparent material include glass, quartz, an optically-transparent resin such as PMMA and a polycarbonate resin, a transparent evaporated metal film, a flexible film such as a polydimethylsiloxane film, a photo-cured film, a metal film, and the like.

Examples of the release agent include a silicon-based release agent, a fluorine-based release agent, a polyethylene-based release agent, a polypropylene-based release agent, a paraffin-based release agent, a montan-based release agent, a carnauba-based release agent, and the like. These release agents may be used either alone or in combination. It is preferable to use the silicon-based release agent. Examples of the silicon-based release agent include polydimethylsiloxane, an acrylic silicone graft polymer, an acrylic siloxane, an aryl siloxane, and the like.

The hydrophobized mold is then brought into pressure contact with the pattern-forming layer. An uneven pattern is formed on the pattern-forming layer by bringing the mold having an uneven pattern into pressure contact with the pattern-forming layer. The mold is normally brought into pressure contact with the pattern-forming layer under a pressure of 0.1 to 100 MPa, preferably 0.1 to 50 MPa, and more preferably 0.1 to 30 MPa. The pressure contact time is normally 1 to 600 seconds, preferably 1 to 300 seconds, and more preferably 1 to 180 seconds.

The pattern-forming layer is then exposed in a state in which the mold is brought into pressure contact with the pattern-forming layer. When the pattern-forming layer is exposed, radicals are generated from a photoinitiator included in the nanoimprint radiation-sensitive composition. As a result, the pattern-forming layer formed of the nanoimprint radiation-sensitive composition is cured in a state in which the uneven pattern of the mold is transferred to the pattern-forming layer. The pattern-forming layer to which the uneven pattern is transferred may be used as an interlayer dielectric of a semiconductor device (e.g., LSI, system LSI, DRAM, SDRAM, RDRAM, or D-RDRAM), a resist film used when producing a semiconductor device, or the like.

When the curable composition is a heat-curable composition, the curable composition is cured by performing a heating step instead of the exposure step. The heating atmosphere, the heating temperature, and the like employed when curing the curable composition by heating are not particularly limited. For example, the curable composition may be heated at 40 to 200° C. in an inert atmosphere or under reduced pressure. A hot plate, an oven, a furnace, or the like may be used when heating the curable composition.

The mold is then removed from the pattern-forming layer. The mold may be removed by an arbitrary method. For example, the mold may be removed by moving the mold away from the substrate while securing the substrate, or may be removed by moving the substrate away from the mold while securing the mold, or may be removed by moving the mold and the substrate in opposite directions.

Step (4)

In the step (4), a pattern is formed on the substrate by etching that utilizes the resist pattern as a mask. The etching is preferably implemented by performing dry etching once or a plurality of times. When the etching selectivity between the protective film and the resist film is high, the protective film, the inorganic film, and the substrate are sequentially dry-etched using the resist pattern as a mask to form a pattern. The dry etching may be performed using a known dry etching system. An oxygen-containing gas (e.g., $O_2$, CO, or $CO_2$), an inert gas (e.g., He, $N_2$, or Ar), a chlorine-based gas (e.g., $Cl_2$ or $BCl_3$), a fluorine-based gas (e.g., $CHF_3$ or $CF_4$), $H_2$, $NH_3$, or the like may be used as a dry etching source gas depending on the elemental composition of the etching target. Note that these gases may be used in combination.

Step (0)

The pattern-forming method may include forming a resist underlayer film on the substrate before the step (1) using a resist underlayer film-forming composition. A known resist underlayer film-forming composition may be used as the resist underlayer film-forming composition. Examples of the resist underlayer film-forming composition include NFC HM8005 (manufactured by JSR Corporation) and the like. The resist underlayer film may be formed by applying the resist underlayer film-forming composition to the substrate to form a film of the resist underlayer film-forming composition, and curing the film by heating while optionally applying UV light, for example. The resist underlayer film-forming composition may be applied by spin coating, roll coating, dip coating, or the like. The heating temperature is normally 150 to 500° C., and preferably 180 to 350° C. The heating time is normally 30 to 1200 seconds, and preferably 45 to 600 seconds. The thickness of the resist underlayer film is normally about 50 to about 500 nm.

An additional underlayer film differing from the resist underlayer film obtained using the resist underlayer film-forming composition may be formed on the substrate. The additional underlayer film may be a carbon film formed by chemical vapor deposition (CVD) or the like. The additional underlayer film is a film that is provided with an antireflective function, flatness, high etching resistance to a fluorine-based gas (e.g., $CF_4$), and the like. A commercially available product such as NFC HM8005 (manufactured by JSR Corporation) may be used to form the additional underlayer film Multilayer Resist Process Inorganic Film-Forming Composition (A)

The multilayer resist process inorganic film-forming composition (A) according to one embodiment of the invention includes [A1] a compound, [B] an organic solvent, and [D] a crosslinking accelerator. The multilayer resist process inorganic film-forming composition (A) may preferably include [C] water. The multilayer resist process inorganic film-forming composition (A) may further include an additional optional component as long as the advantageous effects of the invention are not impaired. The multilayer resist process inorganic film-forming composition (A) can form an inorganic film that allows a resist pattern to be formed thereon, and exhibits excellent dry etching resistance, and may suitably be used for the multilayer resist process. Each component is described in detail below.

Compound [A1]

The compound [A1] is at least one compound selected from the group consisting of a metal compound that includes a hydrolyzable group, a hydrolysate of a metal compound that includes a hydrolyzable group, and a hydrolysis-condensation product of a metal compound that includes a hydrolyzable group. The compound [A1] includes at least one metal element (specific element (1)) selected from the group consisting of the group 6 elements, the group 12 elements, and the group 13 elements. The content of at least one metal element selected from the group consisting of the group 6 elements, the group 12 elements, and the group 13 elements is 50 mol % or more, preferably 70 mol % or more, and more preferably 90 mol % or more, based on the total amount of a metal element and a metalloid element included in the compound [A1].

Examples of the specific element (1) include group 6 elements such as Cr (chromium), Mo (molybdenum), and W (tungsten); group 12 elements such as Zn; and group 13 elements such as Al (aluminum), Ga (gallium), In (indium), and Tl (thallium).

Among these, tungsten and aluminum are preferable. The compound [A1] is preferably a metal alkoxide, a metal carboxylate, or a metal complex that includes the specific element (1). The description given above in connection with the compound [A] included in the inorganic film-forming composition may be applied to the metal alkoxide, the metal carboxylate, and the metal complex.

The hydrolysate is obtained by hydrolyzing the compound [A1]. The hydrolysis-condensation product may be obtained by condensing only the compound [A1], or may be obtained by condensing the compound [A1] and an additional compound. The content of the specific element (1) in the hydrolysis-condensation product is 50 mol % or more, preferably 70 mol % or more, and more preferably 90 mol % or more, based on the total amount of a metal element and a metalloid element included in the hydrolysis-condensation product. The compound [A1] is hydrolyzed by adding water, or water and a catalyst, to the compound [A1], and stirring the mixture at 20 to 100° C. for several hours to several days. Water is normally used in an amount of 100 mol or less, and preferably 5 to 50 mol, based on 100 mol of the compound [A1]. Examples of the catalyst include acid catalysts such as inorganic acids (e.g., hydrochloric acid, sulfuric acid, and nitric acid) and organic acids (e.g., acetic acid, propionic acid, butyric acid, and maleic acid), inorganic or organic alkali catalysts such as sodium hydroxide, potassium hydroxide, ammonia, monoethanolamine, diethanolamine, and tetramethylammonium hydroxide, and the like.

Organic Solvent [B]

The content of the organic solvent [B] is preferably determined so that the content of the compound [A1] in the multilayer resist process inorganic film-forming composition (A) is 0.5 to 20 mass %, and preferably 0.5 to 15 mass % (based on metal oxide). The description given above in connection with the organic solvent [B] included in the inorganic film-forming composition may be applied to the organic solvent [B].

Crosslinking Accelerator [D]

The crosslinking accelerator [D] is preferably used in an amount of 10 parts by mass or less, and more preferably 0.1 to 5 parts by mass, based on 100 parts by mass of the compound [A1]. When the amount of the crosslinking accelerator [D] is within the above range, the etching selectivity ratio can be improved. The description given above in connection with the crosslinking accelerator [D] included in the inorganic film-forming composition may be applied to the crosslinking accelerator [D].

Water [C]

It is preferable that the multilayer resist process inorganic film-forming composition (A) further include the water [C]. The inorganic film-forming reaction can be promoted by incorporating the water [C] in the multilayer resist process inorganic film-forming composition (A). The water [C] is not particularly limited. Examples of the water [C] include distilled water, ion-exchanged water, and the like. The water [C] is preferably used in an amount of 0.1 to 10 parts by mass, and more preferably 1 to 8 parts by mass, based on 100 parts by mass of the multilayer resist process inorganic film-forming composition (A).

Additional Optional Component

The multilayer resist process inorganic film-forming composition (A) may include an additional optional component such as a surfactant as long as the advantageous effects of the invention are not impaired. The description given above in connection with the surfactant that may be included in the inorganic film-forming composition may be applied to the surfactant.

Preparation of Multilayer Resist Process Inorganic Film-Forming Composition (A)

The multilayer resist process inorganic film-forming composition (A) may be prepared by mixing the compound [A1], the water [C], the crosslinking accelerator [D], and an additional optional component in the organic solvent [B] in a given ratio, for example.

The multilayer resist process inorganic film-forming composition (A) is normally filtered through a filter having a pore size of about 0.2 μm, for example.

Multilayer Resist Process Inorganic Film-Forming Composition (B)

The multilayer resist process inorganic film-forming composition (B) according to one embodiment of the invention includes [A2] a compound and [B] an organic solvent. The multilayer resist process inorganic film-forming composition (B) may preferably include [C] water and [D] a crosslinking accelerator. The multilayer resist process inorganic film-forming composition (B) may further include an additional optional component as long as the advantageous effects of the invention are not impaired. The multilayer resist process inorganic film-forming composition (B) can form an inorganic film that allows a resist pattern to be formed thereon, and exhibits excellent dry etching resistance, and may suitably be used for the multilayer resist process. Each component is described in detail below.

Compound [A2]

The compound [A2] is at least one compound selected from the group consisting of a metal complex (I) that includes a hydrolyzable group, a hydrolysate of the metal complex (I) that includes a hydrolyzable group, and a hydrolysis-condensation product of the metal complex (I) that includes a hydrolyzable group. The compound [A2] includes at least one metal element (specific element (2)) selected from the group consisting of the group 3 elements, the group 4 elements, and the group 5 elements. The content of at least one metal element selected from the group consisting of the group 3 elements, the group 4 elements, and the group 5 elements is 50 mol % or more, preferably 70 mol % or more, and more preferably 90 mol % or more, based on the total amount of a metal element and a metalloid element included in the compound [A2].

Examples of the specific element (2) include group 3 elements such as Sc (scandium) and Y (yttrium); group 4 elements such as Ti (titanium), Zr (zirconium), and Hf (hafnium); and group 5 elements such as V (vanadium), Nb (niobium), and Ta (tantalum).

Among these, zirconium, hafnium, vanadium, and titanium are preferable.

Metal Complex (I)

The metal complex (I) is a compound in which a hydrolyzable group is bonded to the specific element (atom) (2). The metal complex (I) is represented by the formula (5).

In the formula (5), M is the specific element (atom) (2), $R^1$ is an alkyl group having 1 to 10 carbon atoms or a cycloalkyl group having 3 to 10 carbon atoms that is substituted with an alkoxy group, or unsubstituted, $R^3$ is an organic group, b and c are independently an integer from 0 to 7, provided that b+c corresponds to the valency of the specific element M, a plurality of $R^1$ are either identical or different when b is equal to or larger than 2, and a plurality of $R^3$ are either identical or different when c is equal to or larger than 2, d is an integer from 0 to 7, and $R^5$ is an organic compound, provided that a plurality of $R^5$ are either identical or different when d is equal to or larger than 2.

The alkoxy group represented by $OR^1$ is a group obtained by removing the hydrogen atom from the hydroxyl group of an alcohol.

The compound represented by the formula (2) is preferable as the alcohol, for example.

$R^2$ in the formula (2) is the same as defined for $R^1$ in the formula (1).

Examples of the compound represented by the formula (2) when $R^2$ is an alkyl group or a cycloalkyl group include methanol, ethanol, 1-propanol, 2-propanol, n-butanol, sec-butanol, pentanol, cyclohexanol, and the like. Examples of the compound represented by the formula (2) when $R^2$ is an alkyl group or a cycloalkyl group that is substituted with an alkoxy group include methoxymethanol, methoxyethanol, ethoxymethanol, ethoxyethanol, methoxypropanol, ethoxypropanol, propoxypropanol, and the like.

The group represented by $OCOR^3$ is a group obtained by removing the hydrogen atom from the carboxyl group of a carboxylic acid.

The compound represented by the formula (4) is preferable as the carboxylic acid, for example.

$R^4$ in the formula (4) is the same as defined for $R^3$ in the formula (5).

Examples of the compound represented by the formula (4) include acetic acid, trifluoroacetic acid, 2-methylpropanoic acid, pentanoic acid, 2,2-dimethylpropanoic acid, butanoic acid, hexanoic acid, 2-ethylhexanoic acid, octanoic acid, nonanoic acid, decanoic acid, acrylic acid, methacrylic acid, salicylic acid, and the like.

Examples of the organic compound represented by $R^5$ include the ether represented by the formula (6).

$R^6$ and $R^7$ in the formula (6) are a saturated or unsaturated hydrocarbon group having 1 to 10 carbon atoms that may include an oxygen atom in the skeletal chain, provided that $R^6$ and $R^7$ optionally bond to each other to form a cyclic structure.

Examples of the ether represented by the formula (6) include methylal, diethyl ether, dipropyl ether, dibutyl ether, diamyl ether, diethyl acetal, dihexyl ether, trioxane, dioxane, and the like.

Further examples of the organic compound represented by $R^5$ include the ketone represented by the formula (7) or (8), and the like.

In the formulas (7) and (8), $R^8$ and $R^{10}$ are independently a saturated or unsaturated hydrocarbon group having 1 to 10 carbon atoms that may include a keto group in the skeletal chain, and $R^9$ and $R^{11}$ are independently a saturated or unsaturated hydrocarbon group having 1 to 10 carbon atoms.

Examples of the ketone represented by the formula (7) or (8) include methyl ethyl ketone, methyl propyl ketone, methyl isobutyl ketone, methyl amyl ketone, methyl cyclohexyl ketone, diethyl ketone, ethyl butyl ketone, trimethylnonanone, acetonylacetone, mesityl oxide, cyclohexanone, diacetone alcohol (4-hydroxy-4-methyl-2-pentanone), acetylacetone (2,4-pentanedione), 2,4-trifluoropentanedione, 2,4-hexafluoropentanedione, ethyl acetoacetate, 2,2,6,6-tetramethyl-3,5-heptanedione, 1,3-diphenyl-1,3-propanedione, 1-phenyl-1,3-butanedione, and the like.

Further examples of the organic compound represented by $R^5$ include the ester represented by the formula (9).

In the formula (9), $R^{14}$ is a saturated or unsaturated hydrocarbon group having 1 to 10 carbon atoms that may include a keto group, a hydroxyl group, or an alkoxy group, and $R^{15}$ is a saturated or unsaturated hydrocarbon group having 1 to 10 carbon atoms that may include an alkoxy group.

Examples of the ester represented by the formula (9) include ethyl formate, methyl acetate, ethyl acetate, butyl acetate, cyclohexyl acetate, methyl propionate, ethyl butyrate, ethyl oxyisobutyrate, ethyl acetoacetate, ethyl lactate, methoxybutyl acetate, diethyl oxalate, diethyl malonate, and the like.

The hydrolysate is obtained by hydrolyzing the metal complex (I). The hydrolysis-condensation product may be obtained by condensing only the metal complex (I), or may be obtained by condensing the metal complex (I) and another metal complex. The content of the specific element (2) in the hydrolysis-condensation product is 50 mol % or more, preferably 70 mol % or more, and more preferably 90 mol % or more, based on the total amount of a metal element and a metalloid element included in the hydrolysis-condensation product. The metal complex (I) is hydrolyzed by adding water, or water and a catalyst, to the metal complex (I), and stirring the mixture at 20 to 100° C. for several hours to several days. Water is normally used in an amount of 100 mol or less, and preferably 5 to 50 mol, based on 100 mol of the compound [A2]. Examples of the catalyst include acid catalysts such as inorganic acids (e.g., hydrochloric acid, sulfuric acid, and nitric acid) and organic acids (e.g., acetic acid, propionic acid, butyric acid, and maleic acid), inorganic or organic alkali catalysts such as sodium hydroxide, potassium hydroxide, ammonia, monoethanolamine, diethanolamine, and tetramethylammonium hydroxide, and the like.

Organic Solvent [B]

The content of the organic solvent [B] is preferably determined so that the content of the compound [A2] in the multilayer resist process inorganic film-forming composition (B) is 0.5 to 20 mass %, and preferably 0.5 to 15 mass % (based on metal oxide). The description given above in connection with the organic solvent [B] included in the inorganic film-foaming composition may be applied to the organic solvent [B].

Water [C]

It is preferable that the multilayer resist process inorganic film-forming composition (B) further include the water [C]. The inorganic film-forming reaction can be promoted by incorporating the water [C] in the multilayer resist process inorganic film-forming composition (B). The water [C] is not particularly limited. Examples of the water [C] include distilled water, ion-exchanged water, and the like. The water [C] is preferably used in an amount of 0.1 to 10 parts by mass, and more preferably 1 to 8 parts by mass, based on 100 parts by mass of the multilayer resist process inorganic film-forming composition (B).

Crosslinking Accelerator [D]

The crosslinking accelerator [D] is preferably used in an amount of 10 parts by mass or less, and more preferably 0.1 to 5 parts by mass, based on 100 parts by mass of the compound [A2]. When the amount of the crosslinking accelerator [D] is within the above range, the etching selectivity ratio can be improved. The description given above in connection with the crosslinking accelerator [D] included in the inorganic film-forming composition may be applied to the crosslinking accelerator [D].

Additional Optional Component

The multilayer resist process inorganic film-forming composition (B) may include an additional optional component such as a surfactant as long as the advantageous effects of the invention are not impaired. The description given above in connection with the surfactant that may be included in the inorganic film-forming composition may be applied to the surfactant.

Preparation of Multilayer Resist Process Inorganic Film-Forming Composition (B)

The multilayer resist process inorganic film-forming composition (B) may be prepared by mixing the compound [A2], the water [C], the crosslinking accelerator [D], and an additional optional component in the organic solvent [B] in a given ratio, for example. The multilayer resist process inorganic film-forming composition (B) is normally filtered through a filter having a pore size of about 0.2 μm, for example.

Pattern-Forming Method (I)

The inorganic film-forming composition (A) and the inorganic film-forming composition (B) may suitably be used for the following pattern-forming method (I) that is used for the multilayer resist process.

The pattern-forming method (I) includes:

(1) forming an inorganic film over a substrate using the inorganic film-forming composition (A) or the inorganic film-forming composition (B);

(2) forming a resist pattern on the inorganic film using a resist composition;

(3) exposing the resist film by applying radiation via a photomask;

(4) developing the exposed resist film to form the resist pattern; and (5) forming a pattern on the substrate by performing dry etching that utilizes the resist pattern as a mask once or a plurality of times.

The pattern-forming method (I) that utilizes the inorganic film-forming composition (A) or the inorganic film-forming composition (B) can suppress a situation in which the resist pattern is lost, collapses, or curves, and accurately transfer the pattern even when forming a thin resist film. Therefore, the pattern-forming method (I) can suitably be used for a pattern-forming process that requires a reduced processing size.

It is preferable that the pattern-forming method (I) further include (0) forming a resist underlayer film on the substrate, and the step (1) include forming the inorganic film on the resist underlayer film Since the inorganic film-forming composition (A) and the inorganic film-forming composition (B) ensure a high etching selectivity ratio for an organic material and an inorganic material, the resist pattern can be advantageously transferred by sequentially etching the inorganic film and the resist underlayer film that includes an organic film using a dry etching process.

It is preferable that the resist composition used in the step (2) include [α] a polymer that includes an acid-labile group that dissociates due to an acid, and the step (4) include developing the exposed resist film using a developer that includes an organic solvent (organic solvent developer) to form a negative resist pattern.

The above configuration makes it possible to suppress a situation in which the resist pattern undergoes a film thickness loss phenomenon. As a result, the pattern-forming method (I) can more accurately transfer the pattern. Each step is described in detail below.

Step (1)

In the step (1), the inorganic film is formed over the substrate using the inorganic film-forming composition (A) or the inorganic film-forming composition (B). Examples of the substrate include a wafer coated with an insulating film (e.g., silicon oxide, silicon nitride, silicon oxynitride, or polysiloxane) or a low-dielectric-constant insulating film (e.g., Black Diamond (manufactured by AMAT), SiLK (manufactured by Dow Chemical), or LKD5109 (manufactured by JSR Corporation)). A patterned substrate having a trench, a via, and the like may also be used. The inorganic film may be formed by applying the inorganic film-forming composition (A) or the inorganic film-forming composition (B) to the surface of the substrate to form a film of the inorganic film-forming composition (A) or the inorganic film-forming composition (B), and curing the film by heating while optionally applying UV light. The inorganic film-forming composition (A) or the inorganic film-forming composition (B) may be applied by spin coating, roll coating, dip coating, or the like. The heating temperature is normally 150 to 500° C., and preferably 180 to 350° C. The heating time is normally 30 to 1200 seconds, and preferably 45 to 600 seconds. The applied inorganic film-forming composition may be exposed to UV light. The thickness of the inorganic film is normally about 5 to about 50 nm.

Step (0)

The pattern-forming method (I) may include forming a resist underlayer film on the substrate before the step (1). Examples of the resist underlayer film include an organic film that is formed using a resist underlayer film-forming composition, a carbon film that is formed by chemical vapor deposition (CVD), and the like. A known resist underlayer film-forming composition may be used as the resist underlayer film-forming composition. Examples of the resist underlayer film-forming composition include NFC HM8005 (manufactured by JSR Corporation) and the like. The resist underlayer film may be formed by applying the resist underlayer film-forming composition to the substrate to form a film of the resist underlayer film-forming composition, and curing the film by heating while optionally applying UV light. The resist underlayer film-forming composition may be applied by spin coating, roll coating, dip coating, or the like. The heating temperature is normally 150 to 500° C., and preferably 180 to 350° C. The heating time is normally 30 to 1200 seconds, and preferably 45 to 600 seconds. The thickness of the resist underlayer film is normally about 50 to about 500 nm.

An additional underlayer film differing from the resist underlayer film obtained using the resist underlayer film-forming composition may be formed on the substrate. The additional underlayer film is a film that is provided with an antireflective function, flatness, high etching resistance to a fluorine-based gas (e.g., $CF_4$), and the like. A commercially available product such as NFC HM8005 (manufactured by JSR Corporation) may be used to form the additional underlayer film.

Steps (2) to (4)

In the steps (2) to (4), the resist composition is applied to the inorganic film, and the resulting resist film is exposed, heated, and developed to form the resist pattern. Examples of the resist composition include a chemically-amplified resist composition that includes an acid generator, and is soluble in an alkaline water-soluble developer, but scarcely soluble in an organic solvent developer in an exposed area, a chemically-amplified resist composition that includes an acid generator and a crosslinking agent, and is scarcely soluble in an alkaline water-soluble developer and an organic solvent developer in an exposed area, a resist composition that includes an alkali-soluble resin and a quinondiazide-based photosensitizer, and is soluble in an alkaline water-soluble developer in an exposed area, and the like. Among these, it is preferable to use the chemically-amplified resist composition that includes an acid generator, and is soluble in an alkaline water-soluble developer, but scarcely soluble in an organic solvent developer in an exposed area.

The resist film may be formed by volatilizing a solvent (i.e., a solvent included in the resist composition) from the film by prebaking the film formed by applying the resist composition. The prebaking temperature is appropriately selected depending on the type of the resist composition and the like. The prebaking temperature is preferably 30 to 200° C., and more preferably 50 to 150° C. The prebaking time is normally 30 to 200 seconds, and preferably 45 to 120 seconds. Note that an additional film may be formed on the surface of the resist film. The thickness of the resist film is normally 1 to 500 nm, and preferably 10 to 300 nm.

The resist film is then exposed by selectively applying radiation to the resist film via a photomask. Radiation used for exposure is appropriately selected from visible rays, ultraviolet rays, deep ultraviolet rays, X-rays, electron beams, γ-rays, molecular beams, ion beams, and the like depending on the type of the acid generator included in the resist composition. It is preferable to use deep ultraviolet rays. It is more preferable to use KrF excimer laser light (wavelength: 248 nm), ArF excimer laser light (wavelength: 193 nm), $F_2$ excimer laser light (wavelength: 157 nm), $Kr_2$ excimer laser light (wavelength: 147 nm), ArKr excimer laser light (wavelength: 134 nm), or EUV light (wavelength: 13 nm, for example). Liquid immersion lithography may also be employed. Note that an immersion upper layer film may be formed on the resist film using an immersion upper layer film-forming composition.

The exposed resist film is subjected to post-exposure bake (PEB) in order to improve the resolution, the pattern profile, the developability, and the like of the resist film. The PEB temperature is appropriately adjusted depending on the type of the resist composition and the like. The PEB temperature is preferably 180° C. or less, and more preferably 150° C. or less. The PEB time is normally 30 to 200 seconds, and preferably 45 to 120 seconds.

The resist film is then developed to form the resist pattern. A developer used for development may be appropriately selected depending on the type of the resist composition. When the resist composition is a chemically-amplified resist composition or a resist composition that includes an alkali-soluble resin, an alkaline aqueous solution prepared by dissolving sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like in water may be used as the developer. An appropriate amount of a water-soluble organic solvent, an alcohol (e.g., methanol or ethanol), or a surfactant may be added to the alkaline aqueous solution. It is preferable to rinse the resist pattern with a rinsing agent after development.

Step (5)

In the step (5), a pattern is formed on the substrate by performing dry etching that utilizes the resist pattern as a mask once or a plurality of times. When the resist underlayer film is formed on the substrate, the inorganic film, the resist underlayer film, and the substrate are sequentially dry-etched using the resist pattern as a mask to form a pattern. The dry etching may be performed using a known dry etching system. An oxygen-containing gas (e.g., $O_2$, CO, or $CO_2$), an inert gas (e.g., He, $N_2$, or Ar), a chlorine-based gas (e.g., $Cl_2$ or $BCl_3$), a fluorine-based gas (e.g., $CHF_3$ or $CF_4$), $H_2$, $NH_3$, or the like may be used as a dry etching source gas depending on the elemental composition of the etching target. Note that these gases may be used in combination.

It is preferable that the resist composition used in the step (2) include [α] a polymer that includes an acid-labile group that dissociates due to an acid, and [13] an acid generator, and the step (4) include developing the exposed resist film using an organic solvent developer to form a negative resist pattern. The resist composition may include an additional polymer other than the polymer [α].

Polymer [α]

The polymer [α] includes an acid-labile group that dissociates due to an acid. The structure of the polymer [α] is not particularly limited as long as the polymer [α] includes an acid-labile group that dissociates due to an acid. It is preferable that the polymer [α] include an acid-labile group-containing structural unit (I) represented by the following formula (10).

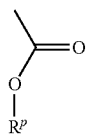

(10)

wherein $R^P$ is an acid-labile group.

When the structural unit (I) includes the group represented by the formula (10), the exposed area of the resist film used for the pattern-forming method (I) shows reduced solubility in the developer, and a film thickness loss in the exposed area can be suppressed.

The structural unit (I) is preferably a structural unit represented by the following formula (11).

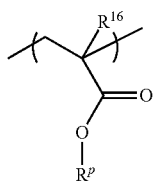

(11)

wherein $R^{16}$ is a hydrogen atom, a methyl group, or a trifluoromethyl group, and $R^P$ is the same as defined for the formula (10).

When the structural unit (I) has the above specific structure, the exposed area of the resist film used for the pattern-forming method (I) shows further reduced solubility in the developer, and a film thickness loss in the exposed area can be further suppressed.

The acid-labile group represented by $R^P$ is preferably a group represented by the following formula (12).

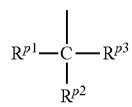

(12)

wherein $R^{p1}$ to $R^{p3}$ are an alkyl group having 1 to 4 carbon atoms or an alicyclic hydrocarbon group having 4 to 20 carbon atoms, provided some or all of the hydrogen atoms of the alkyl group or the alicyclic hydrocarbon group are substituted with a substituent, or unsubstituted, and $R^{p2}$ and $R^{p3}$ optionally bond to each other to form a divalent alicyclic hydrocarbon group having 4 to 20 carbon atoms together with the carbon atom bonded to $R^{p2}$ and $R^{p3}$.

When the acid-labile group represented by $R^P$ in the formulas (10) and (11) is a group having the specific structure represented by the formula (12), the acid-labile group easily dissociates due to an acid generated in the exposed area. Therefore, the solubility of the exposed area of the resist film in the developer can be further reduced, and a film thickness loss can be further suppressed.

Acid Generator [β]

The acid generator [β] generates an acid upon exposure. The acid-labile group included in the polymer [α] dissociates due to the acid generated by the acid generator [β], and the solubility of the polymer [α] in the developer changes.

Examples of the acid generator [β] include onium salt compounds, N-sulfonyloxyimide compounds, halogen-containing compounds, diazoketone compounds, and the like.

Examples of the onium salt compounds include sulfonium salts, tetrahydrothiophenium salts, iodonium salts, phosphonium salts, diazonium salts, pyridinium salts, and the like.

Among these, onium salts are preferable, and sulfonium salts are more preferable. It is still more preferable to use triphenylsulfonium bicyclo[2.2.1]hept-2-yl-1,1-difluoroethanesulfonate or triphenylsulfonium 2-(1-adamantyl)-1,1-difluoroethanesulfonate. These acid generators [β] may be used either alone or in combination.

The acid generator [β] is normally used in an amount of 0.1 to 20 parts by mass, and preferably 0.5 to 15 parts by mass, based on 100 parts by mass of the polymer [α] in order to ensure that the resulting resist composition exhibits sufficient sensitivity and developability.

When the step (4) includes developing the exposed resist film using an organic solvent developer to form a negative resist pattern, the organic solvent included in the developer is preferably at least one organic solvent selected from the group consisting of ether-based solvents, ketone-based solvents, and ester-based solvents. This makes it possible to further reduce the solubility of the exposed area in the developer, and further suppress a film thickness loss.

Examples of the ether-based solvents include diethyl ether, dipropyl ether, dibutyl ether, tetrahydrofuran, dioxane, diphenyl ether, methoxybenzene, and the like.

Examples of the ketone-based solvents include acetone, methyl ethyl ketone, methyl n-propyl ketone, methyl n-butyl ketone, diethyl ketone, methyl isobutyl ketone, methyl n-amyl ketone, methyl isoamyl ketone, ethyl n-butyl ketone, methyl n-hexyl ketone, diisobutyl ketone, trimethylenonane, cyclopentanone, cyclohexanone, cycloheptanone, cyclooctanone, methylcyclohexanone, 2,4-pentanedione, acetonylacetone, acetophenone, and the like.

Examples of the ester-based solvents include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

The content of the organic solvent in the organic solvent developer is 80 mass % or more, and preferably 100 mass %. When the content of the organic solvent in the developer is 80 mass % or more, the contrast of the pattern due to exposure can be improved, and a pattern that exhibits excellent development characteristics and lithographic performance can be formed. Note that a basic compound such as an amine may be added to the organic solvent developer in order to adjust the solubility of the exposed area in the developer. It is preferable to rinse the resist pattern with a rinsing agent after development.

Pattern-forming method (II)

The inorganic film-forming composition (A) and the inorganic film-forming composition (B) may also suitably be used for the following pattern-forming method (II) that is used for the multilayer resist process.

The pattern-forming method (II) includes:

(1) forming an inorganic film over a substrate using the inorganic film-forming composition (A) or the inorganic film-forming composition (B);

(2') forming a resist pattern on the inorganic film by nanoimprint lithography; and (5) forming a pattern on the substrate by performing dry etching that utilizes the resist pattern as a mask once or a plurality of times.

It is preferable that the pattern-forming method (II) further include (0) forming a resist underlayer film on the substrate, and the step (1) include forming the inorganic film on the resist underlayer film.

The pattern-forming method (II) makes it possible to form a pattern utilizing nanoimprint lithography. Note that the description given above in connection with the pattern-forming method (I) may be applied to the steps (O), (1), and (5) included in the pattern-forming method (II). The description given above in connection with the step (3) of the pattern-forming method when forming the resist pattern utilizing nanoimprint lithography may be applied to the step (2').

EXAMPLES

The invention is further described below by way of examples. Note that the invention is not limited to the following examples.

Preparation of inorganic film-forming composition

Synthesis Example A 7.62 parts by mass of tributoxyzirconium 2,4-pentanedionate (50 mass % butyl acetate/butanol) (compound [A]), 45.50 parts by mass of propylene glycol monomethyl ether (organic solvent [B]), 41.69 parts by mass of propylene glycol monoethyl ether (organic solvent [B]), 5.00 parts by mass of water (water [C]), and 0.19 parts by mass of diphenyliodonium trifluoromethanesulfonate (crosslinking accelerator [D]) were mixed to prepare a solution. The solution was filtered through a filter having a pore size of 0.2 μm to prepare an inorganic film-forming composition (1).

Synthesis Example B 30.00 g of tungsten(V) ethoxide and 60.00 g of propylene glycol monomethyl ether (PGME) were mixed, and the mixture was stirred at 25° C. for 10 minutes. After the addition of 10.00 g of water, the mixture was heated to 60° C., and stirred for 4 hours with heating. After completion of the reaction, the mixture was cooled to room temperature. After the addition of 30.00 g of propylene glycol monomethyl ether, a low-boiling-point component was removed using an evaporator. The solid content in the solution measured by a baking method was 10.98%. 17.34 parts by mass of the solution including the compound [A], 46.50 parts by mass of propylene glycol monomethyl ether (organic solvent [B]), 31.06 parts by mass of propylene glycol monoethyl ether (organic solvent [B]), 5.00 parts by mass of water (water [C]), and 0.10 parts by mass of 1-(4-n-butoxynaphthalen-1-yl)tetrahydrothiophenium trifluoromethanesulfonate (crosslinking accelerator [D]) were mixed to prepare a solution. The solution was filtered through a filter having a pore size of 0.2 μm to prepare an inorganic film-forming composition (2).

Preparation of Protective Film-Forming Composition

Synthesis of Organic Film-Forming Polymer [α]

Polymers (α-1) to (α-3) were synthesized using compounds (M-1) to (M-5) represented by the following formulas.

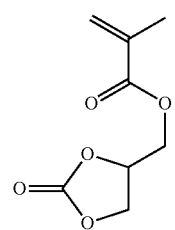

(M-1)

-continued

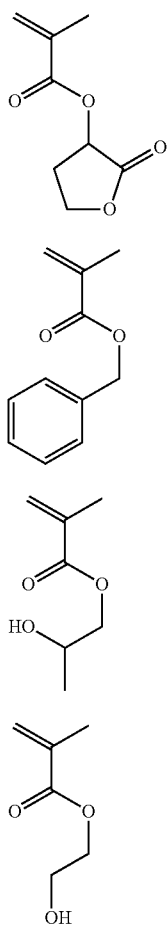

(M-2)

(M-3)

(M-4)

(M-5)

Synthesis Example 1

Synthesis of Polymer (α-1)

A flask (200 ml) was charged with 7.00 g (31 mol %) of the compound (M-1), 6.63 g (31 mol %) of the compound (M-3), 6.37 g (38 mol %) of the compound (M-4), 0.55 g of dimethyl 2,2'-azobis(2-methylpropionate), and 40 g of propylene glycol monomethyl ether. The mixture was stirred at 80° C. for 5 hours under a nitrogen atmosphere to effect polymerization.

After completion of polymerization, the polymer solution was cooled with water to 30° C. or less, and poured into 300 g of a methanol-water mixture (mass ratio: 9:1 (=methanol:water)) to precipitate the polymer. After removing the supernatant liquid, 60 g of methanol was added to the precipitated polymer to wash the polymer. After removing the supernatant liquid, the polymer was dried at 50° C. for 17 hours to obtain a polymer (α-1) (12.8 g, yield: 64%). The polymer (α-1) had an Mw of 21,600 and a dispersity (Mw/Mn) of 2.1. The content of structural units derived from the compound (M-1), the content of structural units derived from the compound (M-3), and the content of structural units derived from the compound (M-4) in the polymer (α-1) determined by $^{13}$C-NMR analysis were 32 mol %, 31 mol %, and 37 mol %, respectively Synthesis Example 2

Synthesis of Polymer (α-2)

A flask (200 ml) was charged with 7.00 g (31 mol %) of the compound (M-1), 6.63 g (31 mol %) of the compound (M-3), 6.37 g (38 mol %) of the compound (M-5), 0.55 g of dimethyl 2,2'-azobis(2-methylpropionate), and 40 g of propylene glycol monomethyl ether. The mixture was stirred at 80° C. for 5 hours under a nitrogen atmosphere. After the addition of 0.23 g (1 mol %) of dimethyl 2,2'-azobis(2-methylpropionate), the mixture was heated to 90° C., and reacted for 1 hour.

A solution including a polymer (α-2) was thus obtained. The polymer (α-2) had an Mw of 24,100 and a dispersity (Mw/Mn) of 2.2. The solid content in the solution was 33.3 mass %.

Synthesis Example 3

Synthesis of Polymer (α-3)

A polymer (α-3) was synthesized in the same manner as in Synthesis Example 2, except that the types and the amounts of the monomers were changed as shown in Table 1.

The Mw and the dispersity (Mw/Mn) of each polymer, and the content of structural units derived from each monomer are also shown in Table 1.

TABLE 1

|  | Polymer [α] | Monomer | Amount (mol %) | Structural unit content (mol %) | Mw | Mw/Mn |
|---|---|---|---|---|---|---|
| Synthesis Example 1 | α-1 | M-1 | 31 | 32 | 21,600 | 2.1 |
|  |  | M-3 | 31 | 31 |  |  |
|  |  | M-4 | 38 | 37 |  |  |
| Synthesis Example 2 | α-2 | M-1 | 31 | 31 | 24,100 | 2.2 |
|  |  | M-3 | 31 | 32 |  |  |
|  |  | M-5 | 38 | 37 |  |  |
| Synthesis Example 3 | α-3 | M-2 | 31 | 30 | 21,900 | 2.1 |
|  |  | M-3 | 31 | 32 |  |  |
|  |  | M-4 | 38 | 38 |  |  |

Preparation of Organic Film-Forming Composition

The components (crosslinking agent [β], crosslinking catalyst [γ], and organic solvent [δ]) other than the polymers (α-1) to (α-3) that were used to prepare an organic film-forming composition are shown below.

Crosslinking Agent [β]

Compound Represented by the Following Formula (β-1)

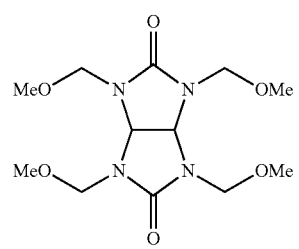

(β-1)

Crosslinking Catalyst (γ)
Compound represented by the following formula (γ-1)

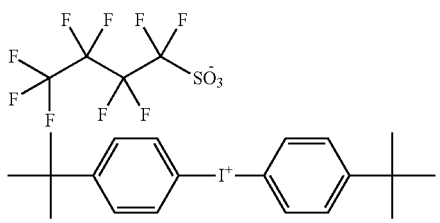

(γ-1)

Solvent [β]
δ-1: Propylene Glycol Monomethyl Ether
δ-2: Propylene Glycol Monomethyl Ether Acetate Synthesis Example 4

Preparation of Organic Film-Forming Composition (1)

100 parts by mass (based on solid) of the polymer (α-1), 20 parts by mass of the crosslinking agent (β-1), 5 parts by mass of the crosslinking catalyst (γ-1), 1800 parts by mass of the solvent (δ-1), and 1800 parts by mass of the solvent (δ-2) were mixed to prepare an organic film-forming composition (1).

Synthesis Examples 5 and 6

Preparation of Organic Film-Forming Compositions (2) and (3)

Organic film-forming compositions (2) and (3) were prepared in the same manner as in Synthesis Example 4, except that the type and the amount of each component were changed as shown in Table 2.

and the mixture was reacted at 60° C. for 4 hours. After completion of the reaction, the flask containing the reaction solution was allowed to cool. After the addition of 50.00 g of propylene glycol monoethyl ether, methanol produced during the reaction was evaporated using an evaporator to obtain 97.3 g of a solution including a polysiloxane (a-1). The solid content in the solution including the polysiloxane (a-1) was 18.0 mass %. The Mw of the polysiloxane (a-1) was 2000.

Synthesis Example 8

1.01 g of oxalic acid was dissolved in 22.01 g of water with heating to prepare an oxalic acid aqueous solution. A flask charged with 23.93 g of tetramethoxysilane, 21.42 g of methyltrimethoxysilane, and 31.64 g of propylene glycol monoethyl ether was fitted with a cooling tube and a dropping funnel containing the oxalic acid aqueous solution. After heating the mixture to 60° C. using an oil bath, the oxalic acid aqueous solution was slowly added dropwise to the mixture, and the mixture was reacted at 60° C. for 4 hours. After completion of the reaction, the flask containing the reaction solution was allowed to cool. After the addition of 50.00 g of propylene glycol monoethyl ether, methanol produced during the reaction was evaporated using an evaporator to obtain 98.1 g of a solution including a polysiloxane (a-2). The solid content in the solution including the polysiloxane (a-2) was 21.5 mass %. The Mw of the polysiloxane (a-2) was 2700.

Preparation of Silicon-Containing Film-Forming Composition

The following organic solvents [b] were used to prepare a silicon-containing film-forming composition.
Organic solvent [b]
b-1: propylene glycol monomethyl ether acetate
b-2: propylene glycol monomethyl ether

TABLE 2

| | Organic film-forming composition | Polymer [α] Type | Polymer [α] Amount (parts by mass) | Crosslinking agent [β] Type | Crosslinking agent [β] Amount (parts by mass) | Crosslinking catalyst [γ] Type | Crosslinking catalyst [γ] Amount (parts by mass) | Polymer [δ] Type | Polymer [δ] Amount (parts by mass) |
|---|---|---|---|---|---|---|---|---|---|
| Synthesis Example 4 | Organic film-forming composition (1) | α-1 | 100 | β-1 | 20 | γ-1 | 5 | δ-1/δ-2 | 1800/1800 |
| Synthesis Example 5 | Organic film-forming composition (2) | α-2 | 100 | β-1 | 20 | γ-1 | 5 | δ-1/δ-2 | 1800/1800 |
| Synthesis Example 6 | Organic film-forming composition (3) | α-3 | 100 | β-1 | 20 | γ-1 | 5 | δ-1/δ-2 | 1800/1800 |

Synthesis of Polysiloxane (A)

Synthesis Example 7

1.28 g of oxalic acid was dissolved in 12.85 g of water with heating to prepare an oxalic acid aqueous solution. A flask charged with 25.05 g of tetramethoxysilane, 3.63 g of phenyltrimethoxysilane, and 57.19 g of propylene glycol monoethyl ether was fitted with a cooling tube and a dropping funnel containing the oxalic acid aqueous solution. After heating the mixture to 60° C. using an oil bath, the oxalic acid aqueous solution was slowly added dropwise to the mixture, Synthesis Example 9

Preparation of Silicon-Containing Film-Forming Composition (1)

100 parts by mass (based on solid) of the polysiloxane (a-1) synthesized in Synthesis Example 7 was dissolved in 3800 parts by mass of the organic solvent (b-1) and 1200 parts by mass of the organic solvent (b-2). The solution was filtered through a filter having a pore size of 0.2 μm to obtain a silicon-containing film-forming composition (1).

Synthesis Example 10

Preparation of Silicon-Containing Film-Forming Composition (2)

100 parts by mass (based on solid) of the polysiloxane (a-2) synthesized in Synthesis Example 8 was dissolved in 3800 parts by mass of the organic solvent (b-1) and 1200 parts by mass of the organic solvent (b-2). The solution was filtered through a filter having a pore size of 0.2 μm to obtain a silicon-containing film-forming composition (2).

Formation of Pattern

Example 1

The inorganic film-forming composition (1) was applied to a silicon wafer (substrate) using a spin coater, and baked at 250° C. for 60 seconds on a hot plate to form an inorganic film having a diameter of 300 mm and a thickness of 20 nm. The organic film-forming composition (1) was applied to the inorganic film using a spin coater, and baked at 205° C. for 60 seconds to form a protective film (organic film) having a thickness of 50 nm. A resist composition ("ARX2014J" manufactured by JSR Corporation) was applied to the protective film, and dried at 90° C. for 60 seconds to form a resist film having a thickness of 100 nm. An immersion upper layer film-forming composition ("NFC TCX091-7" manufactured by JSR Corporation) was applied to the resist film, and dried at 90° C. for 60 seconds to form an immersion upper layer film having a thickness of 30 nm. The resist film was exposed at a dose of 16 mJ/cm$^2$ using an ArF excimer laser exposure system ("S610C" manufactured by Nikon Corporation), and the substrate was heated at 115° C. for 60 seconds. The resist film was then developed for 30 seconds using a 2.38 mass % tetramethylammonium hydroxide (TMAH) aqueous solution to form a 50 nm line-and-space resist pattern (i.e., a pattern in which the width of the resist that remained on the silicon wafer and the width of the trench were 50 nm). The inorganic film and the substrate were sequentially dry-etched using a dry etching system ("Telius SCCM" manufactured by Tokyo Electron Ltd.) utilizing the resist pattern as a mask to form a pattern on the substrate.

Examples 2 to 4

A resist pattern was formed in the same manner as in Example 1, except that the composition shown in Table 3 was used as the protective film-forming composition, and the baking temperature employed when forming the protective film was changed as shown in Table 3.

Example 5

A resist pattern was formed in the same manner as in Example 1, except that the silicon-containing film-forming composition (2) obtained in Synthesis Example 10 was used as the protective film-forming composition, and the baking temperature employed when forming the protective film was changed to 220° C.

Examples 6 to 10

A resist pattern was formed in the same manner as in Example 1, except that the inorganic film-forming composition (2) was used instead of the inorganic film-forming composition (1), the protective film-forming composition shown in Table 3 was used as the protective film-forming composition, and the baking temperature employed when forming the protective film was changed as shown in Table 3.

Comparative Example 1

A pattern was formed in the same manner as in Example 1, except that the protective film was not formed.

EVALUATION

Eluted Metal Concentration

The inorganic film-forming composition (1) was applied to a silicon wafer using a spin coater, and baked at 250° C. for 60 seconds on a hot plate to form an inorganic film having a diameter of 300 mm and a thickness of 20 nm. The protective film-forming composition shown in Table 3 was applied to the inorganic film using a spin coater, and baked for 60 seconds at the temperature shown in Table 3 to form a protective film having a thickness of 50 nm. After placing an O-ring on the protective film, a TMAH developer was brought into contact with the protective film for 3 minutes, and then collected. The zirconium or tungsten concentration (eluted metal concentration) in the TMAH developer was measured using an ICP-MS spectrometer ("7500cs" manufactured by Agilent) to evaluate the amount of metal eluted from the inorganic film. The results are shown in Table 3.

Resist Pattern Forming-Capability

The resist pattern formed in each example or comparative example was observed using a scanning electron microscope (manufactured by Hitachi High-Technologies Corporation). A case where the 50 nm line-and-space pattern did not spread toward the bottom was evaluated as acceptable (A), and a case where the 50 nm line-and-space pattern spread toward the bottom was evaluated as unacceptable (B).

TABLE 3

| | Inorganic film-forming composition | Protective film-forming composition | Baking temperature (° C.) | Eluted metal concentration (ppb) | Resist pattern forming-capability |
|---|---|---|---|---|---|
| Example 1 | Inorganic film-forming composition (1) | Organic film-forming composition (1) | 205 | 1.1 | A |
| Example 2 | Inorganic film-forming composition (1) | Organic film-forming composition (2) | 205 | 0.8 | A |
| Example 3 | Inorganic film-forming composition (1) | Organic film-forming composition (3) | 205 | 0.6 | A |
| Example 4 | Inorganic film-forming composition (1) | Silicon-containing film-forming composition (1) | 220 | 0.1 | A |
| Example 5 | Inorganic film-forming composition (1) | Silicon-containing film-forming composition (2) | 220 | 0.4 | A |

TABLE 3-continued

| | Inorganic film-forming composition | Protective film-forming composition | Baking temperature (° C.) | Eluted metal concentration (ppb) | Resist pattern forming-capability |
|---|---|---|---|---|---|
| Example 6 | Inorganic film-forming composition (2) | Organic film-forming composition (1) | 205 | 1.4 | A |
| Example 7 | Inorganic film-forming composition (2) | Organic film-forming composition (2) | 205 | 0.8 | A |
| Example 8 | Inorganic film-forming composition (2) | Organic film-forming composition (3) | 205 | 0.9 | A |
| Example 9 | Inorganic film-forming composition (2) | Silicon-containing film-forming composition (1) | 220 | 0.3 | A |
| Example 10 | Inorganic film-forming composition (2) | Silicon-containing film-forming composition (2) | 220 | 0.5 | A |
| Comparative Example 1 | Inorganic film-forming composition (1) | — | — | 7.1 | A |

As is clear from the results shown in Table 3, it was confirmed that elution of a metal into the alkaline developer could be significantly suppressed by forming the protective film on the inorganic film as compared with the case where the protective film was not formed. Therefore, it is considered that the pattern-forming method can suppress occurrence of development defects and the like due to a metal eluted from an inorganic film, and reduce contamination of equipment due to a metal eluted from an inorganic film during the multilayer resist process that utilizes an inorganic film.

Preparation of multilayer resist process inorganic film-forming composition (A)

Compound [A1]

The following compounds [A1] were used to prepare a multilayer resist process inorganic film-forming composition (A).
A1-1: tungsten(V) ethoxide
A1-2: zinc bis(2,4-pentanedionate)
A1-3: aluminum(III) 2,4-pentanedionate
A1-4: indium(III) 2,4-pentanedionate
A1-5: tetramethoxysilane
A1-6: methyltrimethoxysilane
A1-7: phenyltrimethoxysilane Synthesis Example 11

30.00 g of the compound (A1-1) and 60.00 g of propylene glycol monomethyl ether (PGME) were mixed, and the mixture was stirred at 25° C. for 10 minutes. After the addition of 10.00 g of water, the mixture was heated to 60° C., and stirred for 4 hours with heating. After completion of the reaction, the mixture was cooled to room temperature. After the addition of 30.00 g of propylene glycol monomethyl ether, a low-boiling-point component was removed using an evaporator to obtain a solution of a hydrolysis-condensation product (A1-8). The solid content in the solution of the hydrolysis-condensation product (A1-8) measured by a baking method was 10.98%.

Synthesis Examples 12 to 15

Hydrolysis-condensation products (A1-9) to (A1-12) were synthesized in the same manner as in Synthesis Example 11, except that the type and the amount of each component were changed as shown in Table 4.

Synthesis Example 16

0.40 g of oxalic acid was dissolved in 19.20 g of water with heating to prepare an oxalic acid aqueous solution. A flask charged with 9.46 g of the compound (A1-5), 3.02 g of the compound (A1-6), 0.88 g of the compound (A1-7), and 64.04 g of PGME was fitted with a cooling tube and a dropping funnel containing the oxalic acid aqueous solution. After heating the mixture to 60° C. using an oil bath, the oxalic acid aqueous solution was slowly added dropwise to the mixture, and the mixture was reacted at 60° C. for 4 hours. After completion of the reaction, the flask containing the reaction solution was allowed to cool, and a low-boiling-point component was removed using an evaporator to obtain a solution of a hydrolysis-condensation product (A1-13). The solid content in the solution of the hydrolysis-condensation product (A1-13) measured by a baking method was 11.90%. The weight average molecular weight (Mw) of the solid was 2900.

TABLE 4

| | Hydrolysis-condensation product | Compound [A1] | | Amount of PGME (g) | Amount of water (g) | Solid content (%) |
|---|---|---|---|---|---|---|
| | | Type | Amount (g) | | | |
| Synthesis Example 11 | A1-8 | A1-1 | 30.00 | 60.00 | 10.00 | 10.98 |
| Synthesis Example 12 | A1-9 | A1-2 | 30.00 | 60.00 | 10.00 | 12.44 |
| Synthesis Example 13 | A1-10 | A1-3 | 30.00 | 60.00 | 10.00 | 12.18 |
| Synthesis Example 14 | A1-11 | A1-4 | 30.00 | 60.00 | 10.00 | 14.13 |
| Synthesis Example 15 | A1-12 | A1-3/A1-4 | 13.21/16.79 | 60.00 | 10.00 | 13.56 |
| Synthesis Example 16 | A1-13 | A1-5/A1-6/A1-7 | 9.46/3.02/0.88 | 67.04 | 19.20 | 11.90 |

The following organic solvents [B] and crosslinking accelerators [D] were used to prepare the multilayer resist process inorganic film-forming composition (A).
Organic Solvent [B]
B-1: propylene glycol monomethyl ether
B-2: propylene glycol monoethyl ether Crosslinking Accelerator [D]
D-1: diphenyliodonium trifluoromethanesulfonate
D-2: 1-(4-n-butoxynaphthalen-1-yl)tetrahydrothiophenium trifluoromethanesulfonate
D-3: tetramethylammonium acetate
D-4: 1,8-diazabicyclo[5,4,0]undec-7-ene p-toluenesulfonate Example 11

17.34 parts by mass of the compound (A1-8) (compound [A]) was dissolved in 46.50 parts by mass of the organic solvent (B-1) (organic solvent [B]) and 31.06 parts by mass of the organic solvent (B-2) (organic solvent [B]). After the addition of 5.00 parts by mass of water (water [C]) and 0.10 parts by mass of the crosslinking accelerator (D-2) (crosslinking accelerator [D]), the solution was filtered through a filter having a pore size of 0.2 μm to prepare a multilayer resist process inorganic film-forming composition (A).

Examples 12 to 15 and Comparative Example 2

A multilayer resist process inorganic film-forming composition (A) was prepared in the same manner as in Example 11, except that the type and the amount of each component were changed as shown in Table 5. Note that the symbol "-" in Table 5 indicates that the corresponding component was not used.
Evaluation
The properties of each multilayer resist process inorganic film-forming composition (A) prepared as described above were evaluated as described below. The results are shown in Table 5.
Resist Pattern Forming-Capability (when Resist Film was Developed Using Alkaline Aqueous Solution)
A resist underlayer film-forming composition ("NFC HM8005" manufactured by JSR Corporation) was applied to a silicon wafer (substrate) using a spin coater, and dried at 250° C. for 60 seconds on a hot plate to form a resist underlayer film having a thickness of 300 nm. The inorganic film-forming composition (A) was applied to the resist underlayer film using a spin coater, and baked at 250° C. for 60 seconds on a hot plate to form an inorganic film having a thickness of 20 nm. A resist composition ("ARX2014J" manufactured by JSR Corporation) was applied to the inorganic film, and dried at 90° C. for 60 seconds to form a resist film having a thickness of 100 nm. An immersion upper layer film-forming composition ("NFC TCX091-7" manufactured by JSR Corporation) was applied to the resist film, and dried at 90° C. for 60 seconds to form an immersion upper layer film having a thickness of 30 nm. The resist film was exposed by liquid immersion lithography at a dose of 16 mJ/cm$^2$ using an ArF excimer laser exposure system ("S610C" manufactured by Nikon Corporation), and the substrate was heated at 115° C. for 60 seconds. The resist film was then developed for 30 seconds using a 2.38 mass % tetramethylammonium hydroxide aqueous solution to form a 50 nm line-and-space resist pattern (i.e., a pattern in which the width of the resist that remained on the silicon wafer and the width of the trench were 50 nm). The resist pattern was observed using a scanning electron microscope (manufactured by Hitachi High-Technologies Corporation). A case where the 50 nm line-and-space pattern did not spread toward the bottom was evaluated as acceptable (A), and a case where the 50 nm line-and-space pattern spread toward the bottom was evaluated as unacceptable (B). The inorganic film and the substrate were sequentially dry-etched using a dry etching system ("Telius SCCM" manufactured by Tokyo Electron Ltd.) utilizing the resist pattern as a mask to transfer the pattern.
Resist Pattern Forming-Capability (when Resist Film was Developed Using Organic Solvent)
A resist underlayer film-forming composition ("NFC HM8005" manufactured by JSR Corporation) was applied to a silicon wafer (substrate) using a spin coater, and dried at 250° C. for 60 seconds on a hot plate to form a resist underlayer film having a thickness of 300 nm. The inorganic film-forming composition (A) was applied to the resist underlayer film using a spin coater, and baked at 250° C. for 60 seconds on a hot plate to form an inorganic film having a thickness of 20 nm. A resist composition was applied to the inorganic film, and dried at 90° C. for 60 seconds to form a resist film having a thickness of 100 nm. An immersion upper layer film-forming composition ("NFC TCX091-7" manufactured by JSR Corporation) was applied to the resist film, and dried at 90° C. for 60 seconds to form an immersion upper layer film having a thickness of 30 nm. The resist film was exposed by liquid immersion lithography at a dose of 16 mJ/cm$^2$ using an ArF excimer laser exposure system ("S610C" manufactured by Nikon Corporation), and the substrate was heated at 115° C. for 60 seconds. The resist film was then subjected to puddle development (30 seconds) using butyl acetate as the developer, and rinsed with MIBC. The substrate was spin-dried at 2000 rpm for 15 seconds to form a 40 nm line/80 nm pitch line-and-space resist pattern. The resist pattern was observed using a scanning electron microscope (manufactured by Hitachi High-Technologies Corporation). A case where the 40 nm line-and-space pattern did not spread toward the bottom was evaluated as acceptable (A), and a case where the 40 nm line-and-space pattern spread toward the bottom was evaluated as unacceptable (B). The inorganic film and the substrate were sequentially dry-etched using a dry etching system ("Telius SCCM" manufactured by Tokyo Electron Ltd.) utilizing the resist pattern as a mask to transfer the pattern.
Resist Pattern Forming-Capability (when Nanoimprint Lithography was Used)
A resist underlayer film-forming composition ("NFC HM8005" manufactured by JSR Corporation) was applied to a silicon wafer (substrate) using a spin coater, and dried at 250° C. for 60 seconds on a hot plate to form a resist underlayer film having a thickness of 300 nm. The inorganic film-forming composition (A) was applied to the resist underlayer film using a spin coater, and baked at 250° C. for 60 seconds on a hot plate to form an inorganic film having a thickness of 20 nm. About 50 μl of a UV-curable composition was spotted onto the inorganic film at the center of the test substrate, and the substrate was placed on the work stage of an imprint system ("EUN-4200" manufactured by Engineering System Co., Ltd.). A quartz template ("NIM-PH350" manufactured by NTT-ATN) (to which a release agent ("HD-1100Z" manufactured by Daikin Industries, Ltd.) was applied in advance by a given method) was attached to the quartz exposure head of the imprint system using a silicone rubber (thickness: 0.2 mm) an adhesive layer. After setting the pressure of the imprint system to 0.2 MPa, the exposure head was moved downward, and the template and the test substrate were caused to adhere to each other through a nanoimprint photo-curable composition. UV exposure was then performed for 15 seconds. After completion of UV exposure, the exposure stage was moved upward, and the template was removed from the cured shape transfer target layer to form a pattern. The resist pattern was observed using a scanning electron microscope (manufactured by Hitachi High-Technologies Corporation). A case where the 50 nm line-and-space pattern was not lost, and was rectangular was evaluated as acceptable (A), and a case where the 50 nm line-and-space pattern was lost was evaluated as unacceptable (B).

Etching Resistance

The inorganic film was etched in two ways using the above etching system. Specifically, the inorganic film was etched under conditions whereby the resist underlayer film (NFC HM8005) was etched at 200 nm/min, or etched under conditions whereby a silicon dioxide film was etched at 100 nm/min. A case where the difference between the initial thickness and the thickness after etching was less than 5 nm was evaluated as acceptable (A) (i.e., the etching selectivity ratio was acceptable), and a case where the difference between the initial thickness and the thickness after etching was 5 nm or more was evaluated as unacceptable (B) (i.e., the etching selectivity ratio was unacceptable). When the etching selectivity is determined to be acceptable, the inorganic film-forming composition (A) advantageously functions as a mask film when processing each film.

TABLE 5

| | Compound [A1] | | Organic solvent [B] | | Water [C] | Crosslinking accelerator [D] | | Resist pattern forming-capability | | | Etching resistance | |
|---|---|---|---|---|---|---|---|---|---|---|---|---|
| | | | | | | | | Development using alkaline aqueous solution | Development using organic solvent | Nano-imprint lithography | Resist underlayer film | Silicon dioxide film |
| | Type | Amount (parts by mass) | Type | Amount (parts by mass) | Amount (parts by mass) | Type | Amount (parts by mass) | | | | | |
| Example 11 | A1-8 | 17.34 | B-1/B-2 | 46.50/31.06 | 5.00 | D-2 | 0.10 | A | A | A | A | A |
| Example 12 | A1-9 | 15.31 | B-1/B-2 | 33.09/46.50 | 5.00 | D-1 | 0.10 | A | A | A | A | A |
| Example 13 | A1-10 | 15.94 | B-1/B-2 | 35.00/49.00 | — | D-2 | 0.06 | A | A | A | A | A |
| Example 14 | A1-11 | 13.74 | B-1/B-2 | 34.70/46.50 | 5.00 | D-3 | 0.06 | A | A | A | A | A |
| Example 15 | A1-12 | 14.33 | B-1/B-2 | 36.61/49.00 | — | D-4 | 0.06 | A | A | A | A | A |
| Comparative Example 2 | A1-13 | 16.81 | B-1 | 78.19 | 5.00 | — | — | A | A | A | B | B |

As is clear from the results shown in Table 5, it was confirmed that the inorganic film-forming composition (A) achieved an excellent etching selectivity ratio, and an excellent resist pattern forming-capability was achieved when using the inorganic film-forming composition (A).

Preparation of Multilayer Resist Process Inorganic Film-Forming Composition (B)

Compound [A2]

The following compounds [A2] were used to prepare a multilayer resist process inorganic film-forming composition (B).

A2-1: di-1-propoxytitanium bis(2,4-pentanedionate) (75 mass % isopropanol)
A2-2: tributoxyzirconium 2,4-pentanedionate (50 mass % butyl acetate/butanol)
A2-3: hafnium 2,4-pentanedionate
A2-4: vanadium 2,4-pentanedionate
A2-5: tetramethoxysilane
A2-6: methyltrimethoxysilane
A2-7: phenyltrimethoxysilane Synthesis Example 17

40.00 g of the compound (A2-1) and 54.06 g of propylene glycol monomethyl ether (PGME) were mixed, and the mixture was stirred at 25° C. for 10 minutes. After the addition of 5.94 g of water, the mixture was heated to 60° C., and stirred for 4 hours with heating. After completion of the reaction, the mixture was cooled to room temperature. After the addition of 50.00 g of propylene glycol monomethyl ether, a low-boiling-point component was removed using an evaporator to obtain a solution of a hydrolysis-condensation product (A2-8). The solid content in the solution of the hydrolysis-condensation product (A2-8) measured by a baking method was 11.00%.

Synthesis Examples 18 and 19

Hydrolysis-condensation products (A2-9) and (A1-10) were synthesized in the same manner as in Synthesis Example 17, except that the type and the amount of each component were changed as shown in Table 6.

Synthesis Example 20

0.27 g of oxalic acid was dissolved in 10.00 g of water with heating to prepare an oxalic acid aqueous solution. A flask charged with 18.61 g of the compound (A2-3), 11.32 g of the compound (A2-4), and 60.00 g of PGME was fitted with a cooling tube and a dropping funnel containing the oxalic acid aqueous solution. After heating the mixture to 60° C. using an oil bath, the oxalic acid aqueous solution was slowly added dropwise to the mixture, and the mixture was reacted at 60° C. for 4 hours. After completion of the reaction, the flask containing the reaction solution was allowed to cool, and a low-boiling-point component was removed using an evaporator to obtain a solution of a hydrolysis-condensation product (A2-11). The solid content in the solution of the hydrolysis-condensation product (A2-11) measured by a baking method was 10.98%.

Synthesis Example 21

0.40 g of oxalic acid was dissolved in 19.20 g of water with heating to prepare an oxalic acid aqueous solution. A flask charged with 9.46 g of the compound (A2-5), 3.02 g of the compound (A2-6), 0.88 g of the compound (A2-7), and 67.04 g of PGME was fitted with a cooling tube and a dropping funnel containing the oxalic acid aqueous solution. After heating the mixture to 60° C. using an oil bath, the oxalic acid aqueous solution was slowly added dropwise to the mixture, and the mixture was reacted at 60° C. for 4 hours. After completion of the reaction, the flask containing the reaction solution was allowed to cool, and a low-boiling-point component was removed using an evaporator to obtain a solution of a hydrolysis-condensation product (A2-12). The solid content in the solution of the hydrolysis-condensation product (A2-12) measured by a baking method was 11.90%.

The weight average molecular weight (Mw) of the solid was 2900.

Evaluation

The properties of each multilayer resist process inorganic film-forming composition (B) prepared as described above were evaluated as described below. The results are shown in Table 7.

Resist Pattern Forming-Capability (when Resist Film was Developed Using Alkaline Aqueous Solution)

The resist pattern forming-capability when the resist film was developed using an alkaline aqueous solution was evalu-

TABLE 6

| | Hydrolysis-condensation product | Compound [A2] Type | Compound [A2] Amount (B) | Amount of PGME (g) | Amount of water (g) | Solid content (%) |
|---|---|---|---|---|---|---|
| Synthesis Example 17 | A2-8 | A2-1 | 40.00 | 54.06 | 5.94 | 11.00 |
| Synthesis Example 18 | A2-9 | A2-2 | 80.00 | 9.44 | 10.56 | 11.32 |
| Synthesis Example 19 | A2-10 | A2-4 | 30.00 | 60.69 | 9.31 | 12.34 |
| Synthesis Example 20 | A2-11 | A2-3/A2-4 | 18.61/11.32 | 60.00 | 10.00 | 10.98 |
| Synthesis Example 21 | A2-12 | A2-5/A2-6/A2-7 | 9.46/3.02/0.88 | 67.04 | 19.20 | 11.90 |

The following organic solvents [B] and crosslinking accelerators [D] were used to prepare the multilayer resist process inorganic film-forming composition (B).

Organic Solvent [B]

B-1: propylene glycol monomethyl ether

B-2: propylene glycol monoethyl ether

Crosslinking Accelerator [D]

D-1: diphenyliodonium trifluoromethanesulfonate

D-2: 1-(4-n-butoxynaphthalen-1-yl)tetrahydrothiophenium trifluoromethanesulfonate D-3: tetramethylammonium acetate D-4: 1,8-diazabicyclo[5,4,0]undec-7-ene p-toluenesulfonate Example 16

5.33 parts by mass of the compound (A2-1) (compound [A]) was dissolved in 89.48 parts by mass of the organic solvent (B-1) (organic solvent [B]). After the addition of 5.00 parts by mass of water (water [C]) and 0.19 parts by mass of the crosslinking accelerator (D-1) (crosslinking accelerator [D]), the solution was filtered through a filter having a pore size of 0.2 μm to prepare a multilayer resist process inorganic film-forming composition (B).

Examples 17 to 21 and Comparative Example 3

A multilayer resist process inorganic film-forming composition (B) was prepared in the same manner as in Example 16, except that the type and the amount of each component were changed as shown in Table 7. Note that the symbol "-" in Table 7 indicates that the corresponding component was not used.

ated in the same manner as in the section "Resist pattern forming-capability (when resist film was developed using alkaline aqueous solution)" described above in connection with the inorganic film-forming composition (A), except that the inorganic film was formed using the inorganic film-forming composition (B) instead of the inorganic film-forming composition (A).

Resist Pattern Forming-Capability (when Resist Film was Developed Using Organic Solvent)

The resist pattern forming-capability when the resist film was developed using an organic solvent was evaluated in the same manner as in the section "Resist pattern forming-capability (when resist film was developed using organic solvent)" described above in connection with the inorganic film-forming composition (A), except that the inorganic film was formed using the inorganic film-forming composition (B) instead of the inorganic film-forming composition (A).

Resist Pattern Forming-Capability (when Nanoimprint Lithography was Used)

The resist pattern forming-capability when nanoimprint lithography was used was evaluated in the same manner as in the section "Resist pattern forming-capability (when nanoimprint lithography was used)" described above in connection with the inorganic film-forming composition (A), except that the inorganic film was formed using the inorganic film-forming composition (B) instead of the inorganic film-forming composition (A).

Etching Resistance

The etching resistance of the inorganic film was evaluated in the same manner as in the section "Etching resistance" described above in connection with the inorganic film-forming composition (A).

TABLE 7

| | Compound [A2] | | Organic solvent [B] | | Water [C] | Crosslinking accelerator [D] | | Resist pattern forming-capability | | | Etching resistance | |
| | | | | | | | | Development using alkaline aqueous solution | Development using organic solvent | Nano-imprint lithography | Resist underlayer film | Silicon dioxide film |
|---|---|---|---|---|---|---|---|---|---|---|---|---|
| | Type | Amount (parts by mass) | Type | Amount (parts by mass) | Amount (parts by mass) | Type | Amount (parts by mass) | | | | | |
| Example 16 | A2-1 | 5.33 | B-1 | 89.48 | 5.00 | D-1 | 0.19 | A | A | A | A | A |
| Example 17 | A2-2 | 7.62 | B-1/B-2 | 45.50/41.69 | 5.00 | D-1 | 0.19 | A | A | A | A | A |
| Example 18 | A2-8 | 3.96 | B-1/B-2 | 45.50/45.50 | 5.00 | D-3 | 0.04 | A | A | A | A | A |
| Example 19 | A2-9 | 18.18 | B-1/B-2 | 49.00/32.82 | — | — | — | A | A | A | A | A |
| Example 20 | A2-10 | 17.67 | B-1/B-2 | 46.50/30.83 | 5.00 | D-2 | 0.10 | A | A | A | A | A |
| Example 21 | A2-11 | 16.21 | B-1/B-2 | 49.00/34.79 | — | D-4 | 0.10 | A | A | A | A | A |
| Comparative Example 3 | A2-12 | 11.90 | B-1 | 83.10 | 5.00 | — | — | A | A | A | B | B |

As is clear from the results shown in Table 7, it was confirmed that the inorganic film-forming composition (B) achieved an excellent etching selectivity ratio, and an excellent resist pattern forming-capability was achieved when using the inorganic film-forming composition (B).

The pattern-forming method according to the embodiments of the invention can suppress elution of a metal from the inorganic film during development of the resist film when implementing the multilayer resist process that utilizes the inorganic film. Therefore, it is possible to suppress occurrence of development defects and the like due to a metal eluted from the inorganic film, and reduce contamination of equipment due to a metal eluted from the inorganic film. Therefore, the embodiments of the invention may suitably be applied to the field of production of semiconductor devices and the like that will be further miniaturized in the future. The multilayer resist process inorganic film-forming composition according to the embodiments of the invention can achieve an excellent resist pattern forming-capability and an excellent etching selectivity ratio. The multilayer resist process that utilizes the inorganic film-forming composition can suppress a situation in which the resist pattern is lost, collapses, or curves, and accurately transfer the pattern even when the thickness of the organic film is reduced. Therefore, the embodiments of the invention may suitably be applied to the production of an LSI (particularly formation of a fine contact hole) that will be further miniaturized in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A multilayer resist process pattern-forming method comprising:
 providing an inorganic film over a substrate, the inorganic film being provided using a composition comprising:
  a compound comprising a metal compound that comprises a hydrolyzable group, a hydrolysate of a metal compound that comprises a hydrolyzable group, a hydrolysis-condensation product of a metal compound that comprises a hydrolyzable group, or a combination thereof, the compound comprising at least one metal element belonging to Group 3, Group 4, Group 5, Group 6, Group 12, or Group 13 of the Periodic Table of the Elements; and
  an organic solvent;
 providing a protective film on the inorganic film;
 providing a resist pattern on the protective film; and
 providing a pattern on the substrate by etching that utilizes the resist pattern as a mask.

2. The multilayer resist process pattern-forming method according to claim 1, further comprising:
 providing a resist underlayer film on the substrate before providing the inorganic film over the substrate,
 wherein the inorganic film is provided on the resist underlayer film.

3. The multilayer resist process pattern-forming method according to claim 1, wherein the resist pattern is provided on the protective film using a process including:
 providing a resist film on the protective film using a resist composition;
 exposing the resist film by applying radiation through a photomask; and
 developing the exposed resist film to provide the resist pattern.

4. The multilayer resist process pattern-forming method according to claim 1, wherein the resist pattern is provided by nanoimprint lithography.

5. The multilayer resist process pattern-forming method according to claim 1, wherein the protective film is an organic film or a silicon-containing film.

6. The multilayer resist process pattern-forming method according to claim 5, wherein the silicon-containing film is formed using a composition that includes a polysiloxane and an organic solvent.

7. The multilayer resist process pattern-forming method according to claim 5, wherein the organic film has a carbon content of 45 mass % or more and less than 70 mass %.

8. The multilayer resist process pattern-forming method according to claim 5, wherein the silicon-containing film has a silicon content of 20 mass % or more.

9. The multilayer resist process pattern-forming method according to claim 1, wherein the protective film has a thickness of 100 nm or less.

10. The multilayer resist process pattern-forming method according to claim 1, wherein the metal compound is a metal alkoxide, a metal carboxylate, or a metal complex.

11. The multilayer resist process pattern-forming method according to claim 10, wherein the metal alkoxide, the metal carboxylate, or the metal complex comprises the at least one metal element belonging to Group 3, Group 4, Group 5, Group 6, Group 12, or Group 13 of the Periodic Table of the Elements.

12. The multilayer resist process pattern-forming method according to claim 10, wherein the metal alkoxide, the metal carboxylate, or the metal complex comprises zirconium.

13. A multilayer resist process inorganic film-forming composition comprising:
   a compound including a metal compound that includes a hydrolyzable group, a hydrolysate of a metal compound that includes a hydrolyzable group, a hydrolysis-condensation product of a metal compound that includes a hydrolyzable group, or a combination thereof;
   an organic solvent; and
   a crosslinking accelerator,
   the compound including at least one metal element belonging to Group 6, Group 12, or Group 13 of the Periodic Table of the Elements in an amount of 50 mol % or more based on a total amount of a metal element and a metalloid element included in the compound.

14. The multilayer resist process inorganic film-forming composition according to claim 13, wherein the metal compound is a metal alkoxide, a metal carboxylate, or a metal complex.

15. The multilayer resist process inorganic film-forming composition according to claim 14, wherein the metal alkoxide, the metal carboxylate, or the metal complex comprises the at least one metal element belonging to Group 6, Group 12, or Group 13 of the Periodic Table of the Elements.

16. A multilayer resist process inorganic film-forming composition comprising:
   a compound including a metal complex that includes a hydrolyzable group, a hydrolysate of the metal complex that includes a hydrolyzable group, a hydrolysis-condensation product of the metal complex that includes a hydrolyzable group, or a combination thereof; and
   an organic solvent,
   the compound including at least one metal element belonging to Group 3, Group 4, or Group 5 of the Periodic Table of the Elements, and a content of the at least one metal element in the compound being 50 mol % or more based on a total amount of a metal element and a metalloid element included in the compound.

17. The multilayer resist process inorganic film-forming composition according to claim 16, wherein the metal complex comprises the at least one metal element belonging to Group 3, Group 4, or Group 5 of the Periodic Table of the Elements.

18. The multilayer resist process inorganic film-forming composition according to claim 16, wherein the metal complex comprises zirconium.

* * * * *